US012191151B2

(12) United States Patent
Lin et al.

(10) Patent No.: US 12,191,151 B2
(45) Date of Patent: Jan. 7, 2025

(54) GATE-ALL-AROUND TRANSISTOR WITH REDUCED SOURCE/DRAIN CONTACT RESISTANCE

(71) Applicant: Taiwan Semiconductor Manufacturing Co., Ltd., Hsinchu (TW)

(72) Inventors: Jui-Ping Lin, Hsinchu (TW); Chen-Ming Lee, Yangmei (TW); Fu-Kai Yang, Hsinchu (TW); Mei-Yun Wang, Chu-Pei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 319 days.

(21) Appl. No.: 17/335,502

(22) Filed: Jun. 1, 2021

(65) Prior Publication Data

US 2022/0310398 A1 Sep. 29, 2022

Related U.S. Application Data

(60) Provisional application No. 63/166,336, filed on Mar. 26, 2021.

(51) Int. Cl.
*H01L 21/285* (2006.01)
*H01L 21/02* (2006.01)
(Continued)

(52) U.S. Cl.
CPC .... *H01L 21/28518* (2013.01); *H01L 21/0259* (2013.01); *H01L 21/3065* (2013.01);
(Continued)

(58) Field of Classification Search
CPC . H01L 21/285–28518; H01L 21/76805; H01L 21/76829; H01L 21/76831;
(Continued)

(56) References Cited

U.S. PATENT DOCUMENTS 9,165,838 B2 10/2015 Nieh et al.
10,153,203 B2 12/2018 Wang et al.
(Continued)

FOREIGN PATENT DOCUMENTS

DE 102020114875 A1 3/2021
KR 20170063353 A 6/2017
(Continued)

*Primary Examiner* — Marcos D. Pizarro
(74) *Attorney, Agent, or Firm* — Slater Matsil, LLP

(57) ABSTRACT

A method includes forming a gate stack, growing a source/drain region on a side of the gate stack through epitaxy, depositing a contact etch stop layer (CESL) over the source/drain region, depositing an inter-layer dielectric over the CESL, etching the inter-layer dielectric and the CESL to form a contact opening, and etching the source/drain region so that the contact opening extends into the source/drain region. The method further includes depositing a metal layer extending into the contact opening. Horizontal portions, vertical portions, and corner portions of the metal layer have a substantially uniform thickness. An annealing process is performed to react the metal layer with the source/drain region to form a source/drain silicide region. The contact opening is filled to form a source/drain contact plug.

20 Claims, 34 Drawing Sheets

(51) Int. Cl.

| | |
|---|---|
| ***H01L 21/3065*** | (2006.01) |
| ***H01L 21/311*** | (2006.01) |
| ***H01L 21/768*** | (2006.01) |
| ***H01L 21/8234*** | (2006.01) |
| ***H01L 29/06*** | (2006.01) |
| ***H01L 29/08*** | (2006.01) |
| ***H01L 29/40*** | (2006.01) |
| ***H01L 29/417*** | (2006.01) |
| ***H01L 29/423*** | (2006.01) |
| ***H01L 29/45*** | (2006.01) |
| ***H01L 29/66*** | (2006.01) |
| ***H01L 29/786*** | (2006.01) |

(52) U.S. Cl.

CPC .. *H01L 21/31111* (2013.01); *H01L 21/76805* (2013.01); *H01L 21/76829* (2013.01); *H01L 21/76831* (2013.01); *H01L 21/76843* (2013.01); *H01L 21/76855* (2013.01); *H01L 21/76883* (2013.01); *H01L 21/823418* (2013.01); *H01L 29/0665* (2013.01); *H01L 29/0673* (2013.01); *H01L 29/0847* (2013.01); *H01L 29/401* (2013.01); *H01L 29/41733* (2013.01); *H01L 29/41766* (2013.01); *H01L 29/42392* (2013.01); *H01L 29/45* (2013.01); *H01L 29/458* (2013.01); *H01L 29/66545* (2013.01); *H01L 29/66553* (2013.01); *H01L 29/66742* (2013.01); *H01L 29/78618* (2013.01); *H01L 29/78696* (2013.01)

(58) Field of Classification Search

CPC ......... H01L 21/76883; H01L 21/76843; H01L 21/76855; H01L 21/823418; H01L 29/0665; H01L 29/0673; H01L 29/0847; H01L 29/401; H01L 29/41733; H01L 29/41766; H01L 29/42392; H01L 29/458; H01L 29/66545; H01L 29/66742; H01L 29/78618; H01L 29/78696; H01L 29/41–41733; H01L 29/786–78618; H01L 21/28537; H01L 21/30–3065; H01L 21/31111; H01L 29/42372–42392; H01L 29/45; H01L 29/66477–6656; H01L 29/6659–66742

USPC .......................................................... 438/151

See application file for complete search history.

(56) References Cited

U.S. PATENT DOCUMENTS

| | | | | |
|---|---|---|---|---|
| 10,867,845 | B2 | 12/2020 | Wang et al. | |
| 11,004,934 | B2 | 5/2021 | Fung et al. | |
| 11,107,690 | B2 | 8/2021 | Hung et al. | |
| 11,158,728 | B2 | 10/2021 | Chung et al. | |
| 11,289,578 | B2 | 3/2022 | Lee et al. | |
| 11,348,839 | B2 | 5/2022 | Loh et al. | |
| 2015/0243565 | A1* | 8/2015 | Nieh | H01L 21/823871 257/369 |
| 2017/0221894 | A1* | 8/2017 | Liu | H01L 21/823814 |
| 2018/0166553 | A1* | 6/2018 | Lee | H01L 29/41766 |
| 2018/0269297 | A1* | 9/2018 | Zhang | H01L 21/76889 |
| 2019/0006485 | A1 | 1/2019 | Kim et al. | |
| 2019/0019684 | A1* | 1/2019 | Xu | C23C 16/42 |
| 2019/0043959 | A1* | 2/2019 | Lee | H01L 29/6656 |
| 2020/0006160 | A1* | 1/2020 | Lin | H01L 21/823871 |
| 2020/0043805 | A1* | 2/2020 | Wang | H01L 21/823821 |
| 2020/0279918 | A1* | 9/2020 | Wu | H01L 29/0673 |
| 2020/0343351 | A1 | 10/2020 | Huang | |
| 2021/0119031 | A1* | 4/2021 | Song | H01L 21/823814 |
| 2021/0217654 | A1* | 7/2021 | Xie | H01L 27/088 |

FOREIGN PATENT DOCUMENTS

| | | | |
|---|---|---|---|
| KR | 20180060943 | A | 6/2018 |
| KR | 20180121826 | A | 11/2018 |
| KR | 20200066539 | A | 6/2020 |
| TW | 202044358 | A | 12/2020 |
| TW | 202107546 | A | 2/2021 |
| TW | 202107571 | A | 2/2021 |
| TW | 202109680 | A | 3/2021 |

* cited by examiner

GATE-ALL-AROUND TRANSISTOR WITH REDUCED SOURCE/DRAIN CONTACT RESISTANCE

PRIORITY CLAIM AND CROSS-REFERENCE

This application claims the benefit of the following provisionally filed U.S. Patent application: Application No. 63/166,336, filed on Mar. 26, 2021, and entitled "Contact Resistance Reduction on Nano Sheet," which application is hereby incorporated herein by reference.

BACKGROUND

With the continuing shrinking of the sizes of integrated circuits, contact resistance is playing an increasingly more important role in the improvement of the performance of the integrated circuits. The contact resistance between source/drain silicide regions and the overlying contact plugs is one of the factors in the performance improvement.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
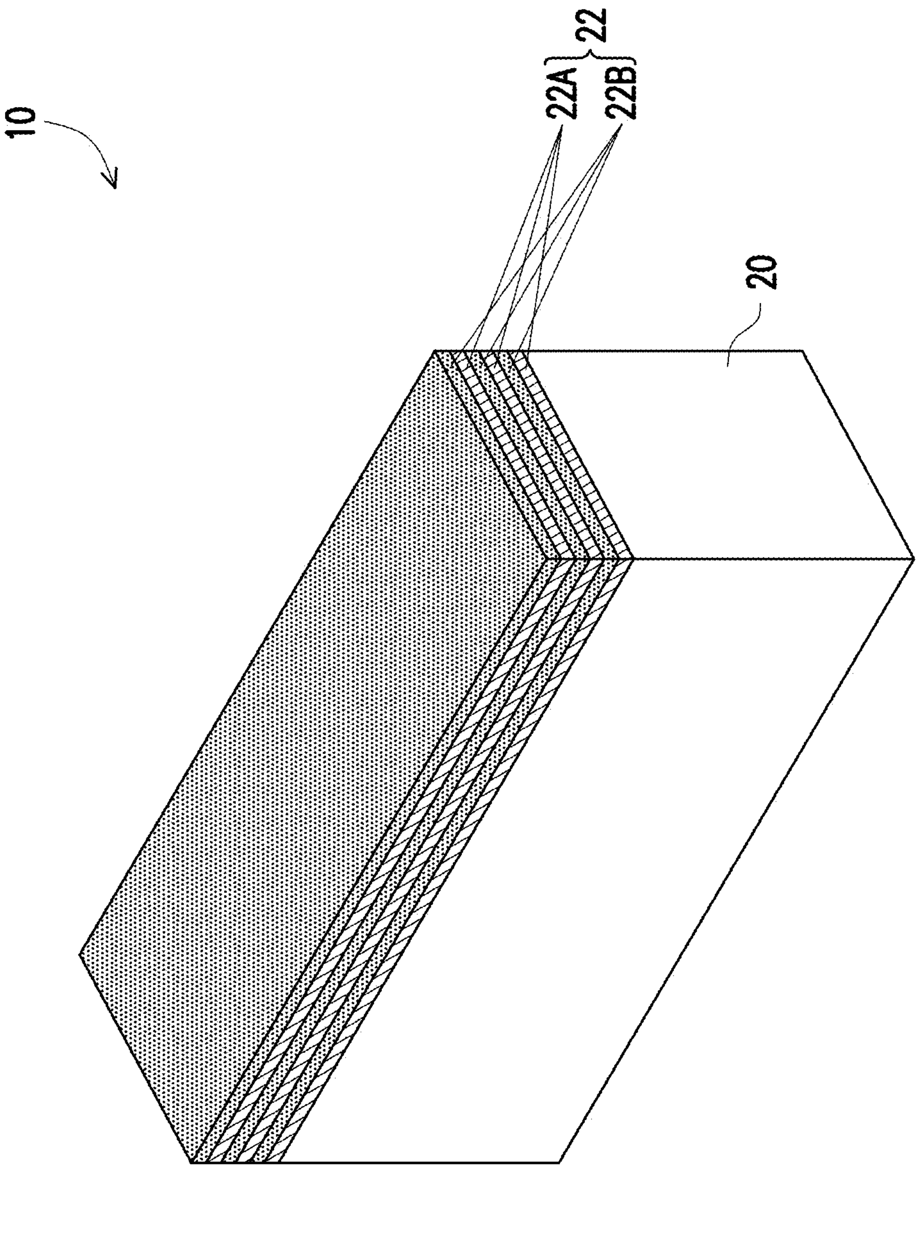
FIGS. 1-4, 5A, 5B, 6A, 6B, 7A, 7B, 8A, 8B, 9A, 9B, 10A, 10B, 10C, 11A, 11B, 12A, 12B, 13A, 13B, 14A, 14B, 15A, 15B, 16A, 16B, 16C, 17A, 17B, 18A, 18B, 18C, 19A, 19B, 20A, 20B, 20C, 21A, 21B, 22A, 22B, 22C, 23A, 23B, 23C, 24A, and 24B illustrate the cross-sectional views of intermediate stages in the formation of a Gate All-Around (GAA) transistor and contact plugs in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A transistor, contact plugs, and the method of forming the same are provided. In accordance with some embodiments of the present disclosure, in the formation of a source/drain contact plug for the transistor, a Contact Etch Stop Layer (CESL) and an Inter-Layer Dielectric (ILD) over a source/drain region are etched to reveal the source/drain region. The source/drain region is also etched deeply to form a contact opening extending into the source/drain region. An isolation layer is formed to extend into the contact opening, and a conformal deposition method is used to form a metal layer extending into the contact opening, which forms source/drain silicide region with the source/drain region. By adopting the conformal deposition process, the metal layer is thicker where it needs to be, hence the silicide region may be thicker at corners of the subsequently formed source/drain contact plug. The source/drain silicide region provides a large landing area for the source/drain contact plug. The contact resistance is thus reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 29:
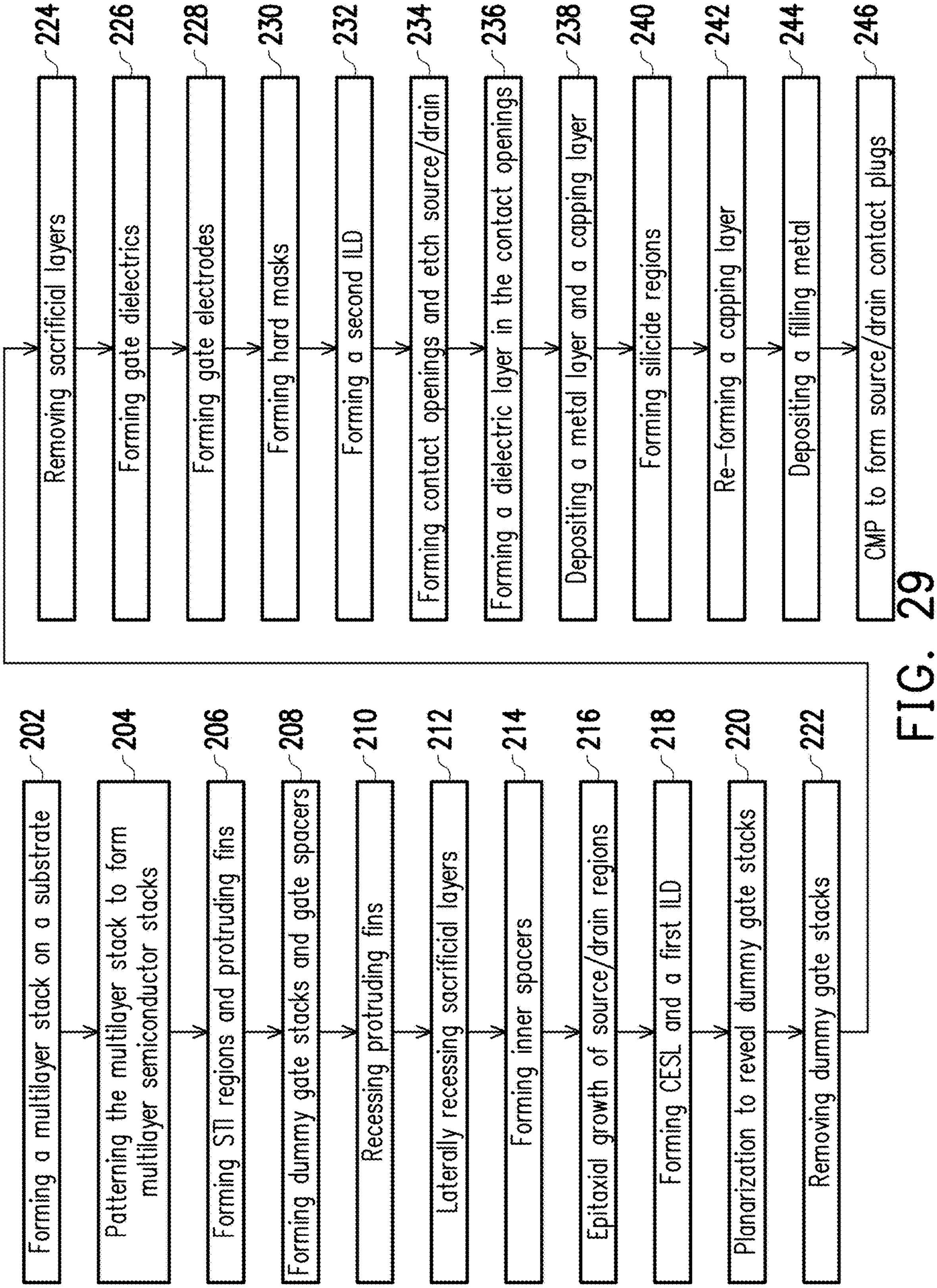
FIG. 29 illustrates a process flow for forming a GAA transistor and contact plugs in accordance with some embodiments.

FIGS. 1-4, 5A, 5B, 6A, 6B, 7A, 7B, 8A, 8B, 9A, 9B, 10A, 10B, 10C, 11A, 11B, 12A, 12B, 13A, 13B, 14A, 14B, 15A, 15B, 16A, 16B, 16C, 17A, 17B, 18A, 18B, 18C, 19A, 19B, 20A, 20B, 20C, 21A, 21B, 22A, 22B, 22C, 23A, 23B, 23C, 24A, and 24B illustrate the cross-sectional views of intermediate stages in the formation of a Gate-All-Around (GAA) transistor in accordance with some embodiments of the present disclosure. The corresponding processes are also reflected schematically in the process flow 200 as shown in FIG. 29.

Referring to FIG. 1, a perspective view of wafer 10 is shown. Wafer 10 includes a multilayer structure comprising multilayer stack 22 on substrate 20. In accordance with some embodiments, substrate 20 is a semiconductor substrate, which may be a silicon substrate, a silicon germanium (SiGe) substrate, or the like, while other substrates and/or structures, such as semiconductor-on-insulator (SOI), strained SOI, silicon germanium on insulator, or the like, could be used. Substrate 20 may be doped as a p-type semiconductor, although in other embodiments, it may be doped as an n-type semiconductor.

In accordance with some embodiments, multilayer stack 22 is formed through a series of deposition processes for depositing alternating materials. The respective process is illustrated as process 202 in the process flow 200 shown in FIG. 29. In accordance with some embodiments, multilayer stack 22 comprises first layers 22A formed of a first semiconductor material and second layers 22B formed of a second semiconductor material different from the first semiconductor material.

In accordance with some embodiments, the first semiconductor material of a first layer 22A is formed of or comprises SiGe, Ge, Si, GaAs, InSb, GaSb, InAlAs, InGaAs, GaSbP, GaAsSb, or the like. In accordance with some embodiments, the deposition of first layers 22A (for example, SiGe) is through epitaxial growth, and the corresponding deposition method may be Vapor-Phase Epitaxy (VPE), Molecular Beam Epitaxy (MBE), Chemical Vapor deposition (CVD), Low Pressure CVD (LPCVD), Atomic Layer Deposition (ALD), Ultra High Vacuum CVD (UHVCVD), Reduced Pressure CVD (RPCVD), or the like. In accordance with some embodiments, the first layer 22A is formed to a first thickness in the range between about 30 Å and about 300 Å. However, any suitable thickness may be utilized while remaining within the scope of the embodiments.

Once the first layer 22A has been deposited over substrate 20, a second layer 22B is deposited over the first layer 22A. In accordance with some embodiments, the second layers 22B is formed of or comprises a second semiconductor material such as Si, SiGe, Ge, GaAs, InSb, GaSb, InAlAs, InGaAs, GaSbP, GaAsSb, combinations of these, or the like, with the second semiconductor material being different from the first semiconductor material of first layer 22A. For example, in accordance with some embodiments in which the first layer 22A is silicon germanium, the second layer 22B may be formed of silicon, or vice versa. It is appreciated that any suitable combination of materials may be utilized for first layers 22A and the second layers 22B.

In accordance with some embodiments, the second layer 22B is epitaxially grown on the first layer 22A using a deposition technique similar to that is used to form the first layer 22A. In accordance with some embodiments, the second layer 22B is formed to a similar thickness to that of the first layer 22A. The second layer 22B may also be formed to a thickness that is different from the first layer 22A. In accordance with some embodiments, the second layer 22B may be formed to a second thickness in the range between about 10 Å and about 500 Å, for example.

Once the second layer 22B has been formed over the first layer 22A, the deposition process is repeated to form the remaining layers in multilayer stack 22, until a desired topmost layer of multilayer stack 22 has been formed. In accordance with some embodiments, first layers 22A have thicknesses the same as or similar to each other, and second layers 22B have thicknesses the same as or similar to each other. First layers 22A may also have the same thicknesses as, or different thicknesses from, that of second layers 22B. In accordance with some embodiments, first layers 22A are removed in the subsequent processes, and are alternatively referred to as sacrificial layers 22A throughout the description. In accordance with alternative embodiments, second layers 22B are sacrificial, and are removed in the subsequent processes.

In accordance with some embodiments, there are some pad oxide layer(s) and hard mask layer(s) (not shown) formed over multilayer stack 22. These layers are patterned, and are used for the subsequent patterning of multilayer stack 22.

Figure 2:
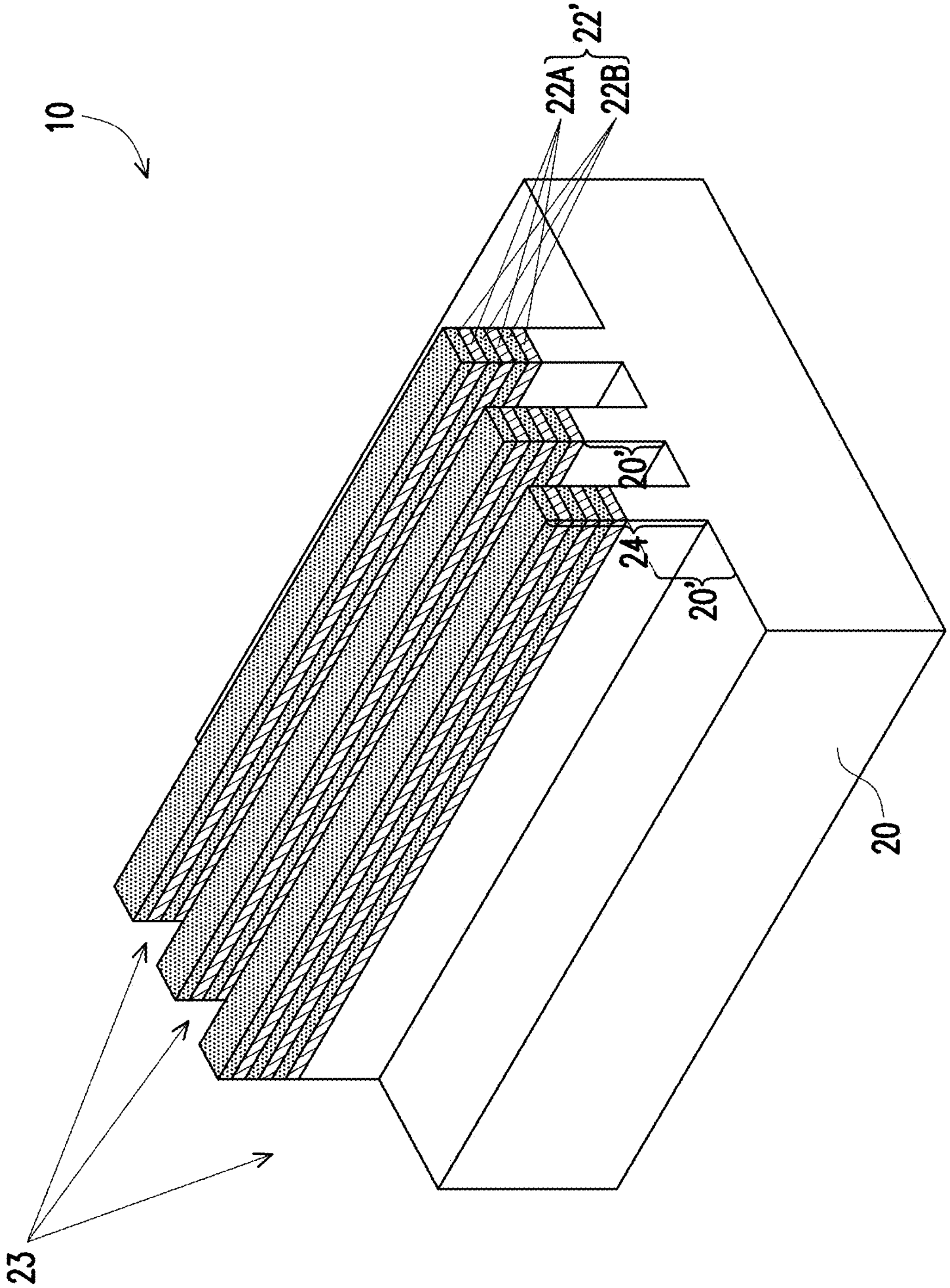

Referring to FIG. 2, multilayer stack 22 and a portion of the underlying substrate 20 are patterned in an etching process(es), so that trenches 23 are formed. The respective process is illustrated as process 204 in the process flow 200 shown in FIG. 29. Trenches 23 extend into substrate 20. The remaining portions of multilayer stacks are referred to as multilayer stacks 22' hereinafter. Underlying multilayer stacks 22', some portions of substrate 20 are left, and are referred to as substrate strips 20' hereinafter. Multilayer stacks 22' include semiconductor layers 22A and 22B. Semiconductor layers 22A are alternatively referred to as sacrificial layers, and Semiconductor layers 22B are alternatively referred to as nanostructures hereinafter. The portions of multilayer stacks 22' and the underlying substrate strips 20' are collectively referred to as semiconductor strips 24.

In above-illustrated embodiments, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 3:
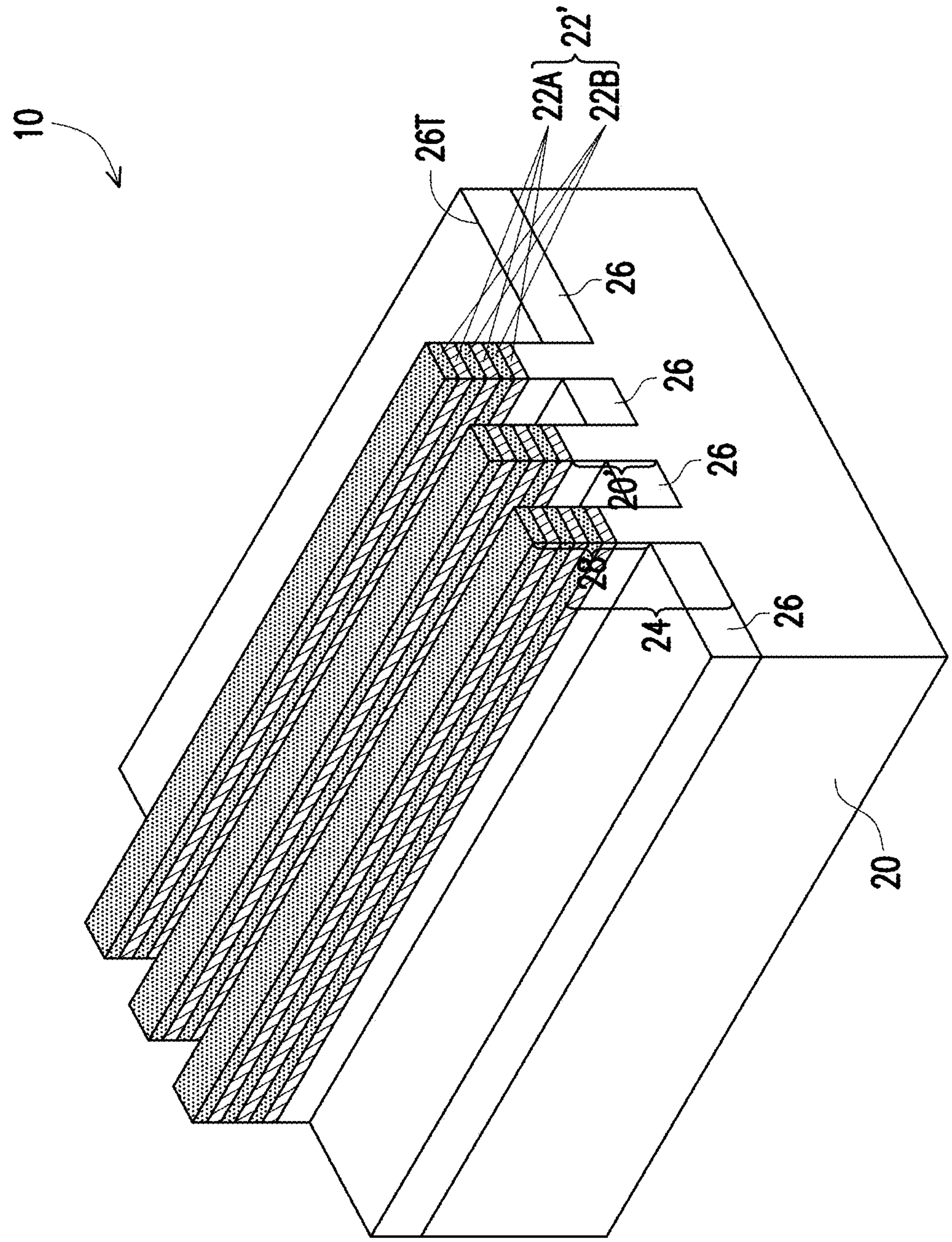

FIG. 3 illustrates the formation of isolation regions 26, which are also referred to as Shallow Trench Isolation (STI) regions throughout the description. The respective process is illustrated as process 206 in the process flow 200 shown in FIG. 29. STI regions 26 may include a liner oxide (not shown), which may be a thermal oxide formed through the thermal oxidation of a surface layer of substrate 20. The liner oxide may also be a deposited silicon oxide layer formed using, for example, ALD, High-Density Plasma Chemical Vapor Deposition (HDPCVD), CVD, or the like. STI regions 26 may also include a dielectric material over the liner oxide, wherein the dielectric material may be formed using Flowable Chemical Vapor Deposition (FCVD), spin-on coating, HDPCVD, or the like. A planarization process such as a Chemical Mechanical Polish (CMP) process or a mechanical grinding process may then be performed to level the top surface of the dielectric material, and the remaining portions of the dielectric material are STI regions 26.

STI regions 26 are then recessed, so that the top portions of semiconductor strips 24 protrude higher than the top surfaces 26T of the remaining portions of STI regions 26 to form protruding fins 28. Protruding fins 28 include multilayer stacks 22' and may include the top portions of substrate strips 20'. The recessing of STI regions 26 may be performed through a dry etching process, wherein $NF_3$ and $NH_3$, for example, are used as the etching gases. During the etching process, plasma may be generated. Argon may also be included. In accordance with alternative embodiments of the present disclosure, the recessing of STI regions 26 is performed through a wet etching process. The etching chemical may include HF, for example.

Figure 4:
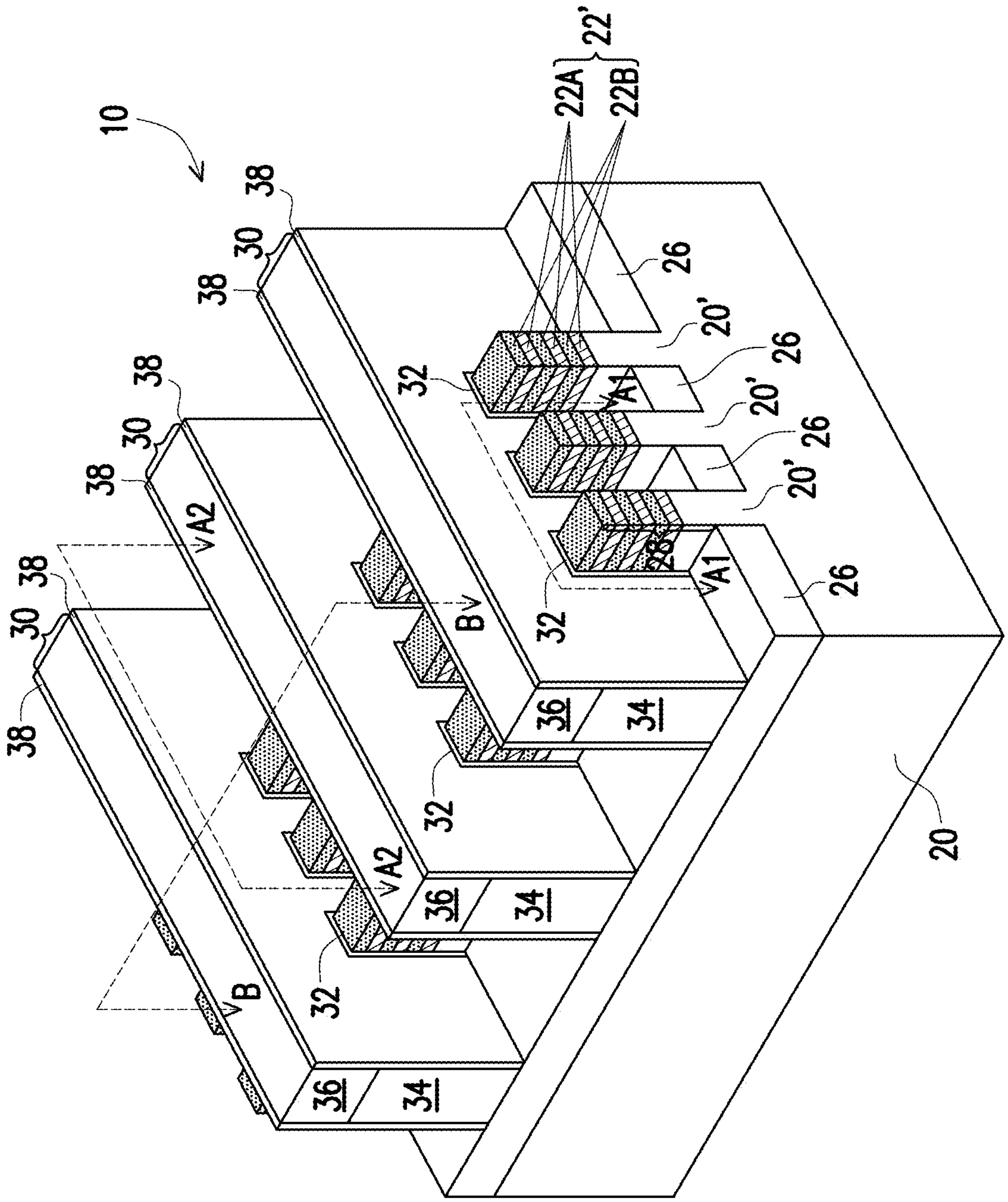

Referring to FIG. 4, dummy gate stacks 30 and gate spacers 38 are formed on the top surfaces and the sidewalls of (protruding) fins 28. The respective process is illustrated as process 208 in the process flow 200 shown in FIG. 29. Dummy gate stacks 30 may include dummy gate dielectrics 32 and dummy gate electrodes 34 over dummy gate dielectrics 32. Dummy gate dielectrics 32 may be formed by oxidizing the surface portions of protruding fins 28 to form oxide layers, or by depositing a dielectric layer such as a silicon oxide layer. Dummy gate electrodes 34 may be formed, for example, using polysilicon or amorphous silicon, and other materials such as amorphous carbon may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, silicon oxy-carbo nitride, or multilayers thereof. Dummy gate stacks 30 may cross over a single one or a plurality of protruding fins 28 and the STI regions 26 between protruding fins 28. Dummy gate stacks 30 also have lengthwise directions perpendicular to the lengthwise directions of protruding fins 28. The formation of dummy gate stacks 30 includes forming a dummy gate dielectric layer, depositing a dummy gate electrode layer over the dummy gate dielectric layer, depositing one or more hard mask layers, and then patterning the formed layers through a patterning process(es).

Next, gate spacers 38 are formed on the sidewalls of dummy gate stacks 30. In accordance with some embodiments of the present disclosure, gate spacers 38 are formed of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multilayer structure including a plurality of dielectric layers. The formation process of gate spacers 38 may include depositing one or a plurality of dielectric layers, and then performing an anisotropic etching process(es) on the dielectric layer(s). The remaining portions of the dielectric layer(s) are gate spacers 38.

Figure 5B:
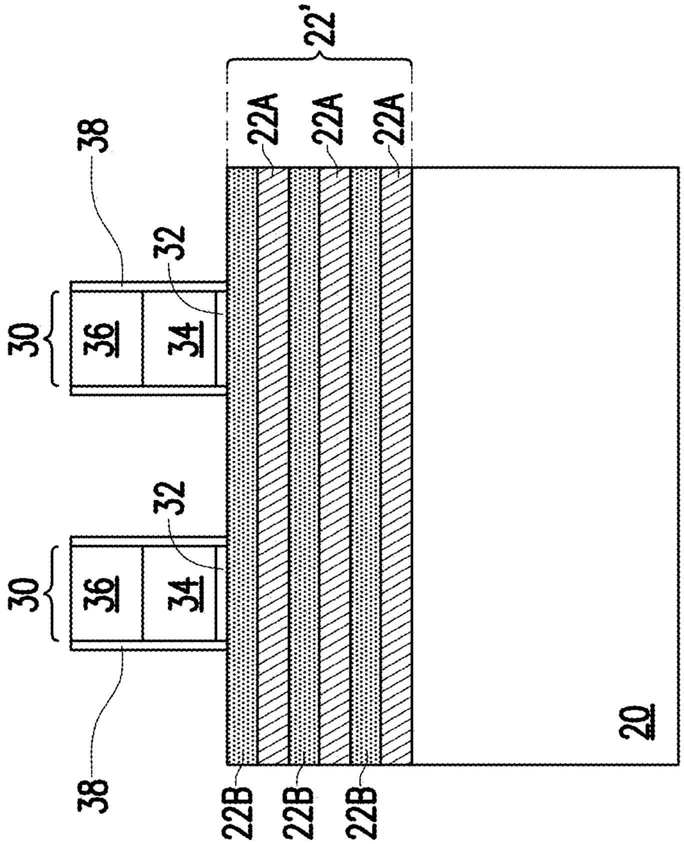
Figure 5A:
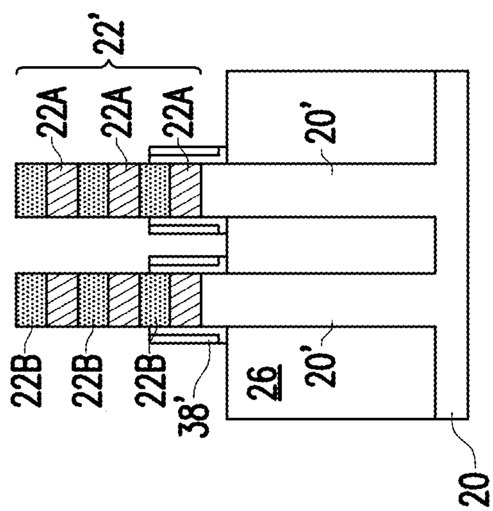

FIGS. 5A and 5B illustrate the cross-sectional views of the structure shown in FIG. 4. FIG. 5A illustrates the reference cross-section A1-Al in FIG. 4, which cross-section cuts through the portions of protruding fins 28 not covered by gate stacks 30 and gate spacers 38, and is perpendicular to the gate-length direction. Fin spacers 38', which are on the sidewalls of protruding fins 28, are also illustrated. FIG. 5B illustrates the reference cross-section B-B in FIG. 4, which reference cross-section is parallel to the lengthwise directions of protruding fins 28.

Figure 6B:
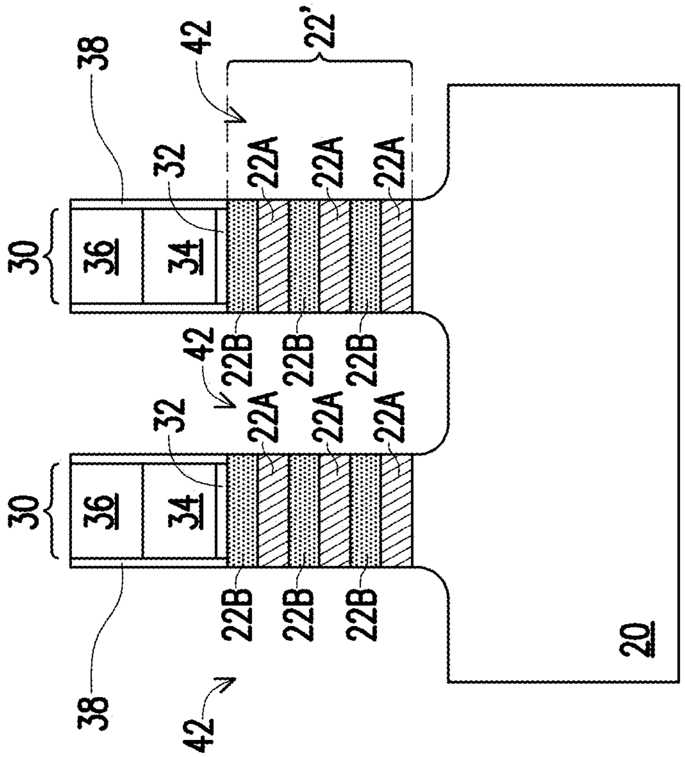
Figure 6A:
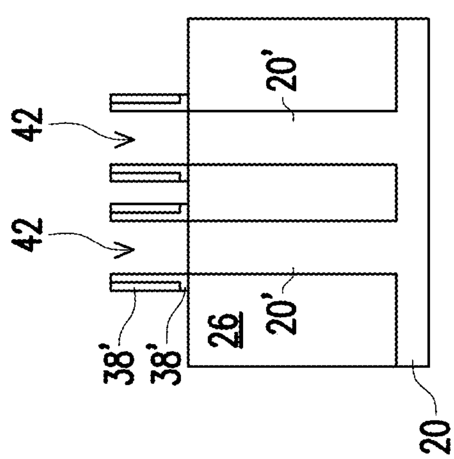

Referring to FIGS. 6A and 6B, the portions of protruding fins 28 that are not directly underlying dummy gate stacks 30 and gate spacers 38 are recessed through an etching process to form recesses 42. The respective process is illustrated as process 210 in the process flow 200 shown in FIG. 29. For example, a dry etch process may be performed using $C_2F_6$, $CF_4$, $SO_2$, the mixture of HBr, $Cl_2$, and $O_2$, the mixture of HBr, $Cl_2$, $O_2$, and $CH_2F_2$, or the like to etch multilayer semiconductor stacks 22' and the underlying substrate strips 20'. The bottoms of recesses 42 are at least level with, or may be lower than (as shown in FIG. 6B), the bottoms of multilayer semiconductor stacks 22'. The etching may be anisotropic, so that the sidewalls of multilayer semiconductor stacks 22' facing recesses 42 are vertical and straight, as shown in FIG. 6B.

Figure 7A:
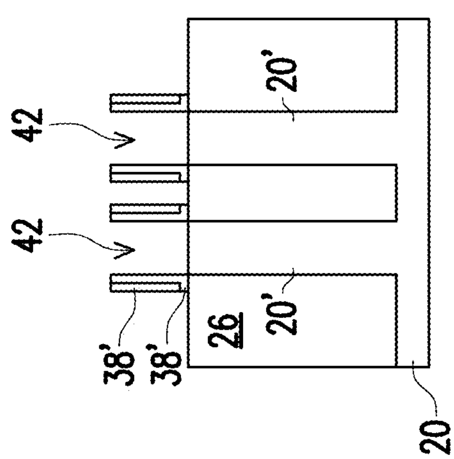
Figure 7B:
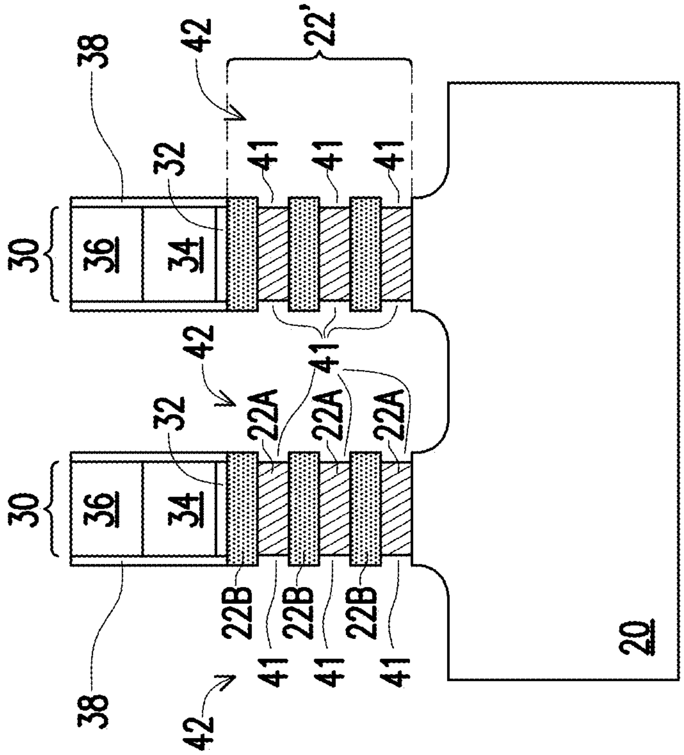

Referring to FIGS. 7A and 7B, sacrificial semiconductor layers 22A are laterally recessed to form lateral recesses 41, which are recessed from the edges of the respective overlying and underlying nanostructures 22B. The respective process is illustrated as process 212 in the process flow 200 shown in FIG. 29. The lateral recessing of sacrificial semiconductor layers 22A may be achieved through a wet etching process using an etchant that is more selective to the material (for example, silicon germanium (SiGe)) of sacrificial semiconductor layers 22A than the material (for example, silicon (Si)) of the nanostructures 22B and substrate 20. For example, in an embodiment in which sacrificial semiconductor layers 22A are formed of silicon germanium and the nanostructures 22B are formed of silicon, the wet etching process may be performed using an etchant such as hydrochloric acid (HCl). The wet etching process may be performed using a dip process, a spray process, a spin-on process, or the like, and may be performed using any suitable process temperatures (for example, between about 400° C. and about 600° C.). In accordance with alternative embodiments, the lateral recessing of sacrificial semiconductor layers 22A is performed through an isotropic dry etching process or a combination of a dry etching process and a wet etching process.

Figure 8B:
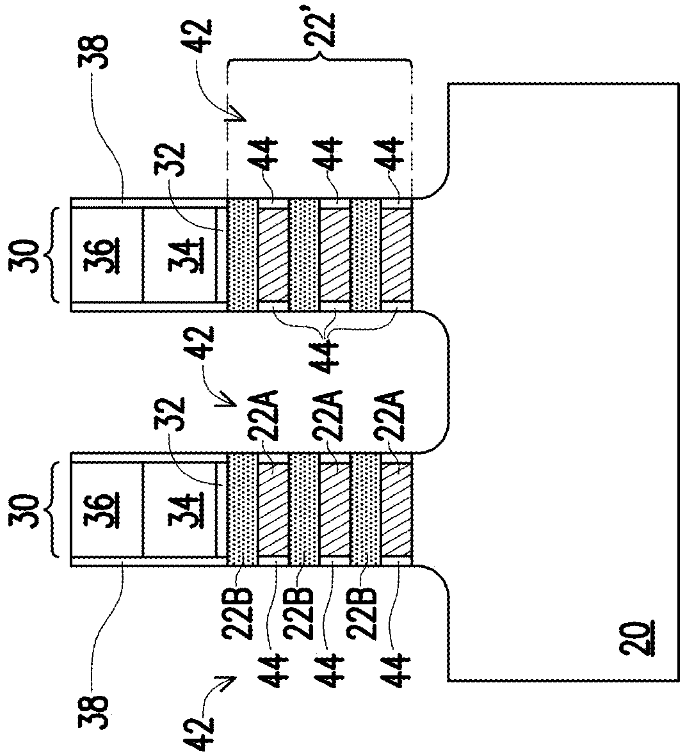
Figure 8A:
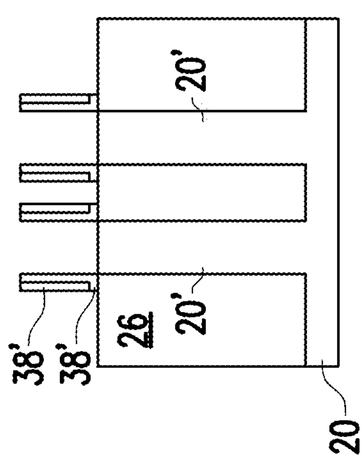

Referring to FIGS. 8A and 8B, inner spacers 44 are formed in the lateral recesses 41. The respective process is illustrated as process 214 in the process flow 200 shown in FIG. 29. The inner spacers 44 act as isolation features between subsequently formed source/drain regions and a gate structure. The formation process may include depositing a conformal dielectric layer and then trimming the conformal dielectric layer. The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the inner spacers 44.

Figure 9B:
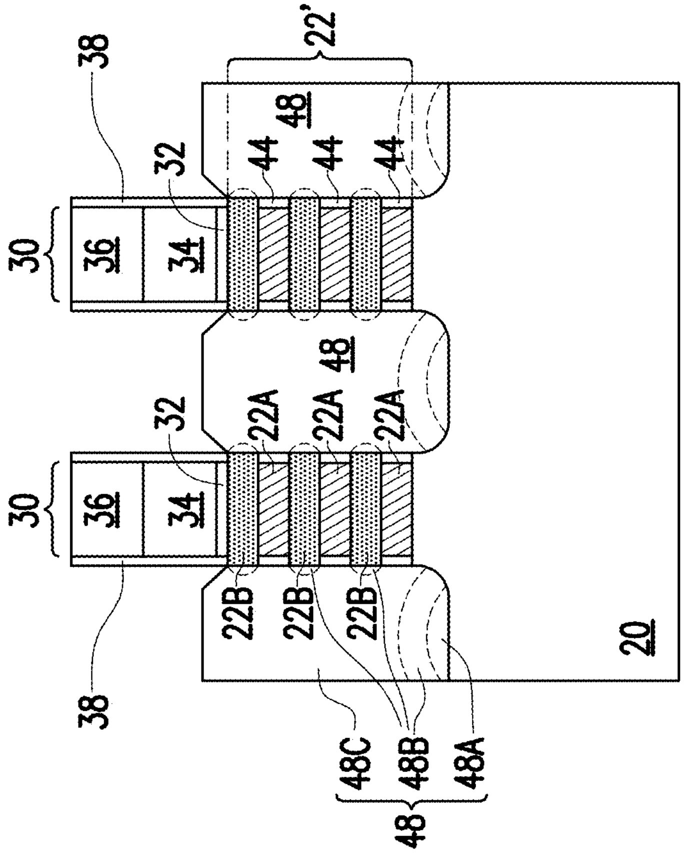

Although the inner sidewalls and the outer sidewalls of the inner spacers 44 are schematically illustrated as being straight in FIG. 9B, the inner sidewalls of the inner spacers 44 may be convex, and the outer sidewalls of the inner spacers 44 may be concave or convex. The inner spacers 44 may be used to prevent the damage to subsequently formed source/drain regions, which damage may be caused by subsequent etching processes for forming replacement gate structures.

Figure 9A:
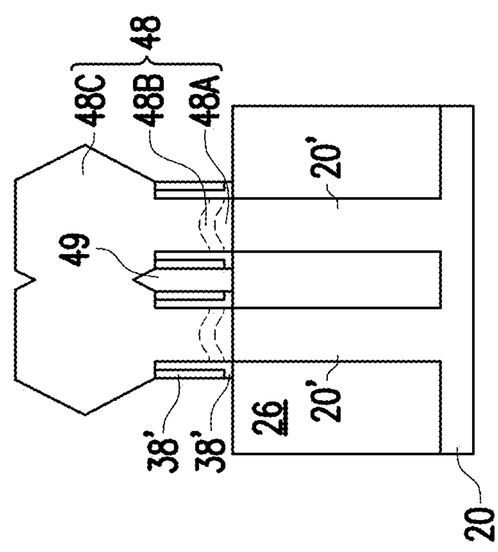

Referring to FIGS. 9A and 9B, epitaxial source/drain regions 48 are formed in recesses 42. The respective process is illustrated as process 216 in the process flow 200 shown in FIG. 29. In accordance with some embodiments, the source/drain regions 48 may exert stress on the nanostructures 22B, which are used as the channels of the corresponding GAA transistors, thereby improving performance. Depending on whether the resulting transistor is a p-type transistor or an n-type transistor, a p-type or an n-type impurity may be in-situ doped with the proceeding of the epitaxy. For example, when the resulting transistor is a p-type Transistor, silicon germanium boron (SiGeB), silicon boron (SiB), or the like may be grown. Conversely, when the resulting transistor is an n-type Transistor, silicon phosphorous (SiP), silicon carbon phosphorous (SiCP), or the like may be grown. After recesses 42 are filled with epitaxy regions 48, the further epitaxial growth of epitaxy regions 48 causes epitaxy regions 48 to expand horizontally, and facets may be formed. The further growth of epitaxy regions 48 may also cause neighboring epitaxy regions 48 to merge with each other. Voids (air gaps) 49 (FIG. 9A) may be generated. Epitaxy regions 48 may include a plurality of sub-layers, which are denoted as 48A, 48B, and 48C in accordance with some embodiments. The sub-layers have different concentrations/atomic percentage of silicon, germanium, carbon, and dopant.

After the epitaxy process, epitaxy regions 48 may be further implanted with a p-type or an n-type impurity to form source and drain regions, which are also denoted using reference numeral 48. In accordance with alternative embodiments of the present disclosure, the implantation process is skipped when epitaxy regions 48 are in-situ doped with the p-type or n-type impurity during the epitaxy, and the epitaxy regions 48 are also source/drain regions.

Figure 10B:
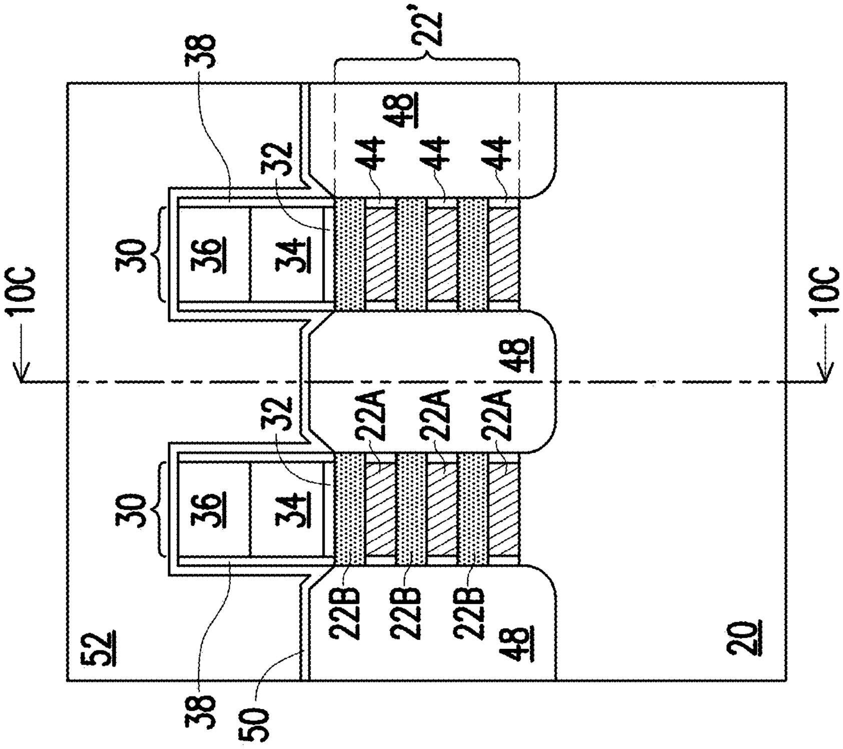
Figure 10A:
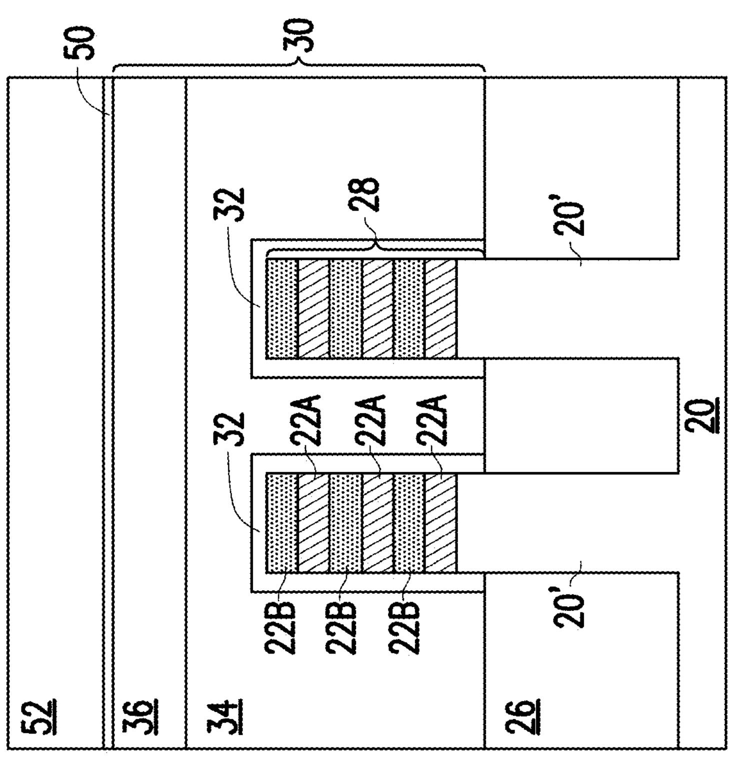
Figure 10C:
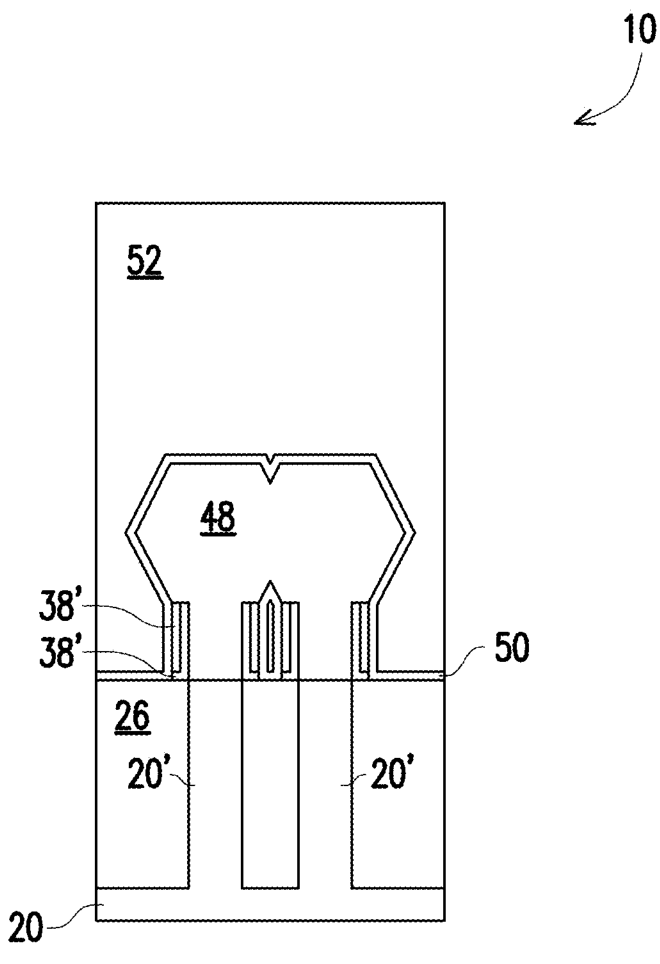

FIGS. 10A, 10B, and 10C illustrate the cross-sectional views of the structure after the formation of CESL 50 and ILD 52. The respective process is illustrated as process 218 in the process flow 200 shown in FIG. 29. FIG. 10C illustrates the reference cross-section 10C-10C in FIG. 10B. CESL 50 may be formed of silicon oxide, silicon nitride, silicon carbo-nitride, or the like, and may be formed using CVD, ALD, or the like. ILD 52 may include a dielectric material formed using, for example, FCVD, spin-on coating, CVD, or any other suitable deposition method. ILD 52 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), Undoped Silicate Glass (USG), or the like.

Figure 11B:
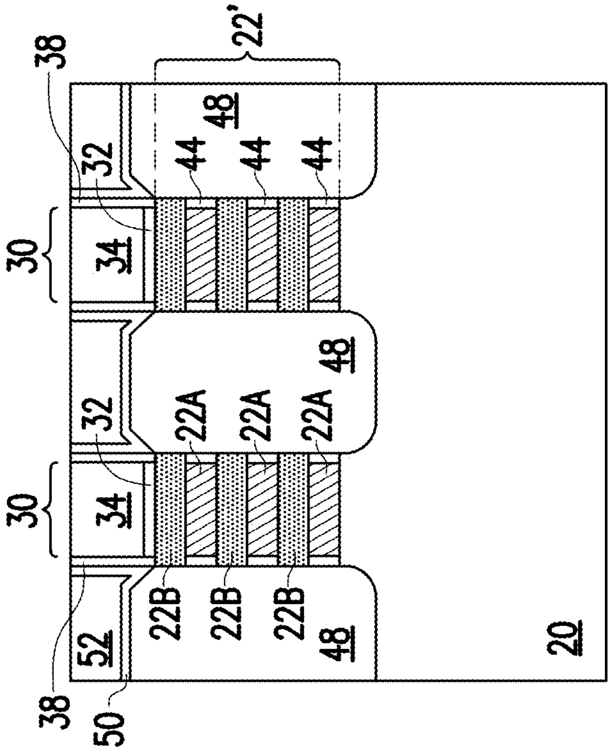
Figure 11A:
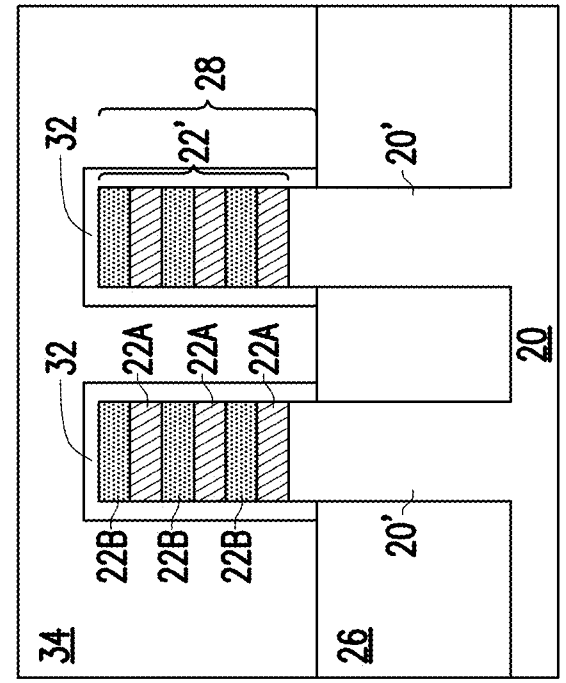

FIGS. 11A and 11B through FIGS. 14A and 14B illustrate the process for forming replacement gate stacks. In FIGS. 11A and 11B, a planarization process such as a CMP process or a mechanical grinding process is performed to level the top surface of ILD 52. The respective process is illustrated as process 220 in the process flow 200 shown in FIG. 29. In accordance with some embodiments, the planarization process may remove hard masks 36 to reveal dummy gate electrodes 34, as shown in FIG. 11A. In accordance with alternative embodiments, the planarization process may reveal, and is stopped on, hard masks 36. In accordance with some embodiments, after the planarization process, the top surfaces of dummy gate electrodes 34 (or hard masks 36), gate spacers 38, and ILD 52 are level within process variations.

Figure 12B:
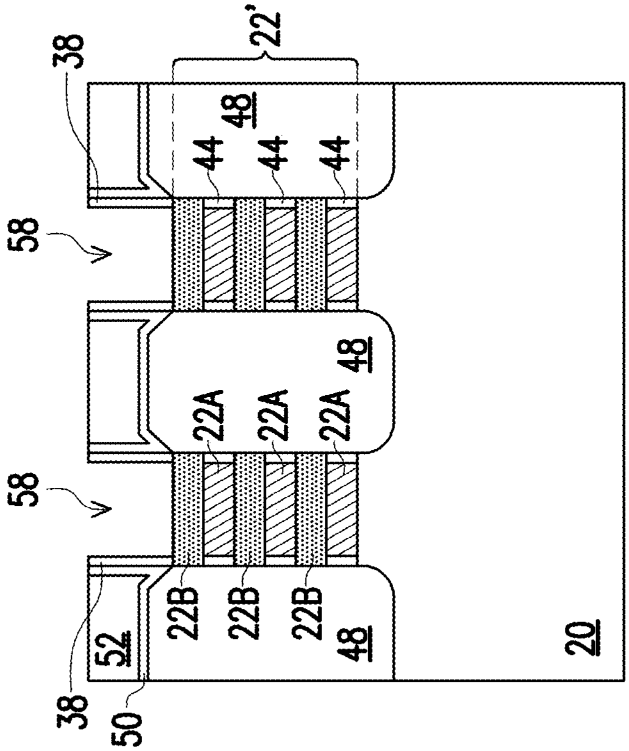
Figure 12A:
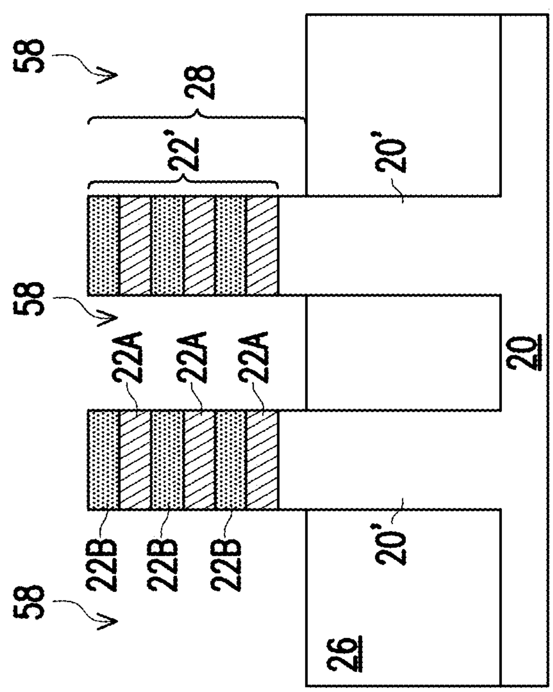

Next, dummy gate electrodes 34 (and hard masks 36, if remaining) are removed in one or more etching processes, so that recesses 58 are formed, as shown in FIGS. 12A and 12B. The respective process is illustrated as process 222 in the process flow 200 shown in FIG. 29. The portions of the dummy gate dielectrics 32 in recesses 58 are also removed. In accordance with some embodiments, dummy gate electrodes 34 and dummy gate dielectrics 32 are removed through an anisotropic dry etch process. For example, the etching process may be performed using reaction gas(es) that selectively etch dummy gate electrodes 34 at a faster rate than ILD 52. Each recess 58 exposes and/or overlies portions of multilayer stacks 22', which include the future channel regions in subsequently completed nano-FETs. The portions of the multilayer stacks 22' are between neighboring pairs of the epitaxial source/drain regions 48.

Figure 13A:
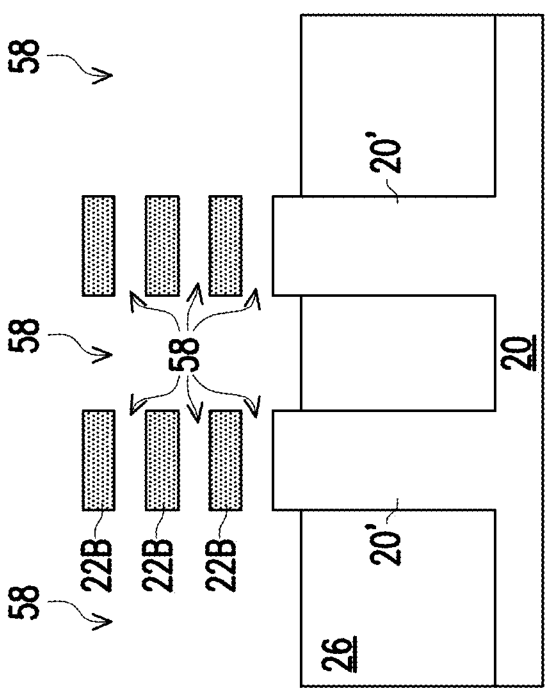
Figure 13B:
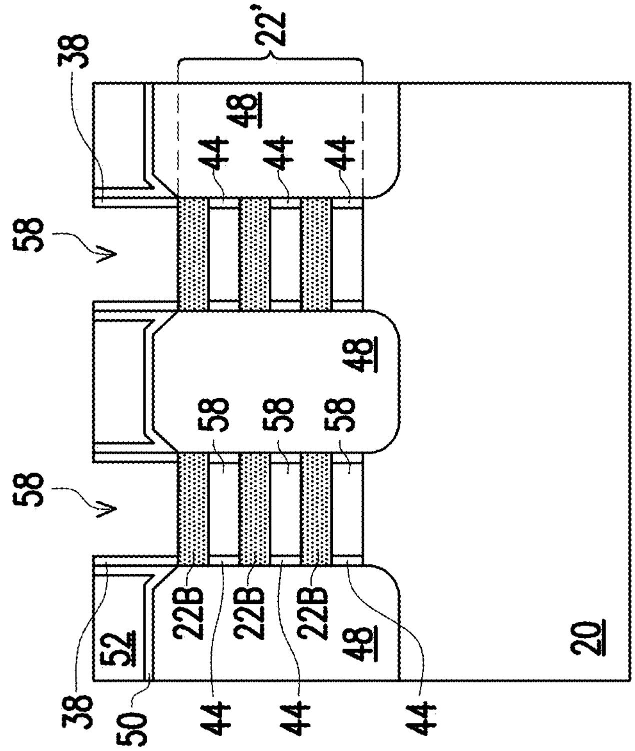

Sacrificial layers 22A are then removed to extend recesses 58 between nanostructures 22B, and the resulting structure is shown in FIGS. 13A and 13B. The respective process is illustrated as process 224 in the process flow 200 shown in FIG. 29. Sacrificial layers 22A may be removed by performing an isotropic etching process such as a wet etching process using etchants which are selective to the materials of sacrificial layers 22A, while nanostructures 22B, substrate 20, STI regions 26 remain relatively un-etched as compared to sacrificial layers 22A. In accordance with some embodiments in which sacrificial layers 22A include, for example, SiGe, and nanostructures 22B include, for example, Si or SiC, tetra methyl ammonium hydroxide (TMAH), ammonium hydroxide ($NH_4OH$), or the like may be used to remove sacrificial layers 22A.

Figure 14B:
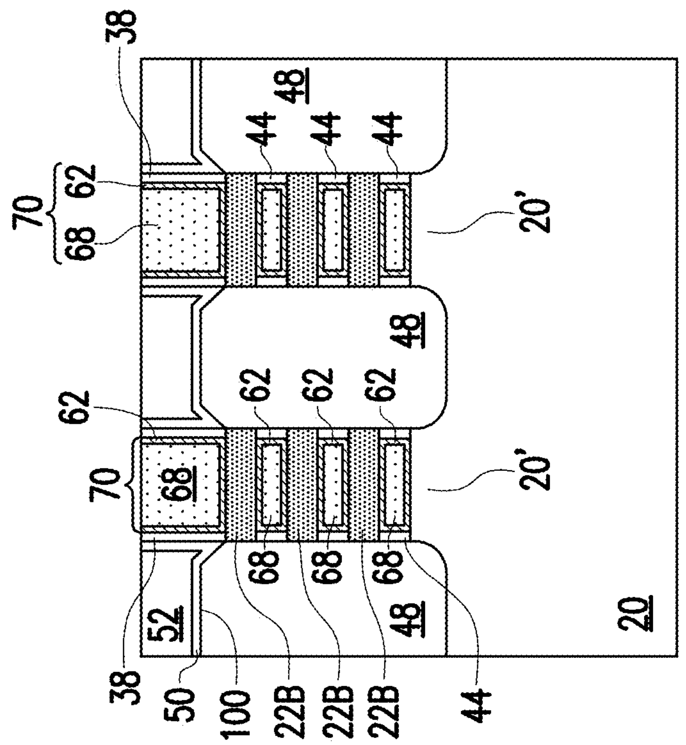
Figure 14A:
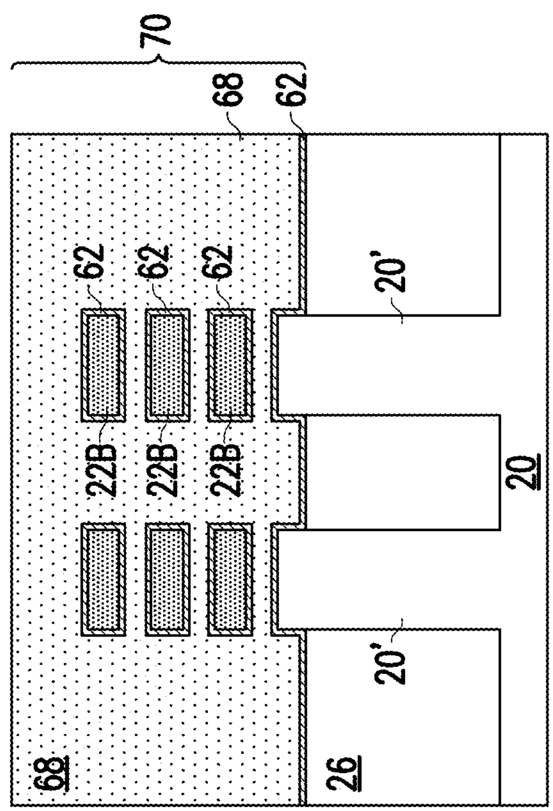

Referring to FIGS. 14A and 14B, gate dielectrics 62 are formed. The respective process is illustrated as process 226 in the process flow 200 shown in FIG. 29. In accordance with some embodiments, each of gate dielectric 62 includes an interfacial layer and a high-k dielectric layer on the interfacial layer. The interfacial layer may be formed of or comprises silicon oxide, which may be deposited through a conformal deposition process such as ALD or CVD. In accordance with some embodiments, the high-k dielectric layers comprise one or more dielectric layers. For example, the high-k dielectric layer(s) may include a metal oxide or a silicate of hafnium, aluminum, zirconium, lanthanum, manganese, barium, titanium, lead, and combinations thereof.

Gate electrodes 68 are then formed. In the formation, conductive layers are first formed on the high-k dielectric layer and filling the remaining portions of recesses 58. The respective process is illustrated as process 228 in the process flow 200 shown in FIG. 29. Gate electrodes 68 may include a metal-containing material such as TiN, TaN, TiAl, TiAlC, cobalt, ruthenium, aluminum, tungsten, combinations thereof, and/or multilayers thereof. For example, although in FIGS. 14A and 14B, a single layer is illustrated to represent a gate electrode 68, gate electrodes 68 may comprise any number of layers including any number of capping/adhesion layers, work function layers, and possibly a filling material. Gate dielectrics 62 and gate electrodes 68 also fill the spaces between adjacent ones of nanostructures 22B, and fill the spaces between the bottom ones of nanostructures 22B and the underlying substrate strips 20'. After the filling of recesses 58, a planarization process such as a CMP process or a mechanical grinding process is performed to remove the excess portions of the gate dielectrics and the material of gate electrodes 68, which excess portions are over the top surface of ILD 52. Gate electrodes 68 and gate dielectrics 62 are collectively referred to as gate stacks 70 of the resulting nano-FETs.

Figure 15B:
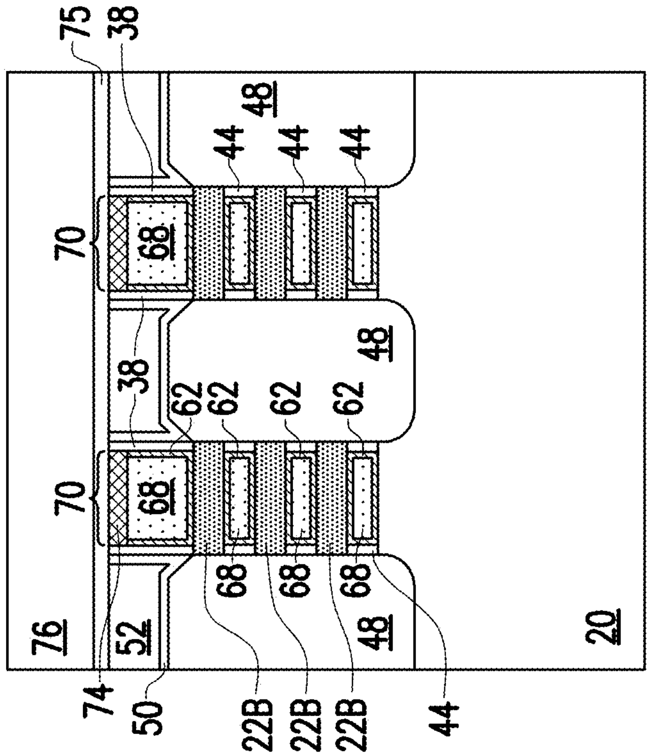
Figure 15A:
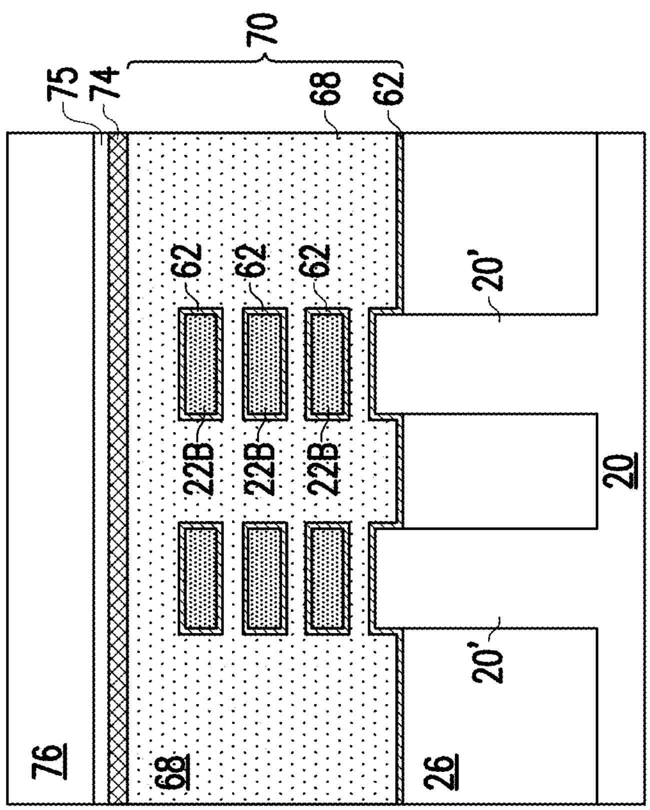

In the processes shown in FIGS. 15A and 15B, gate stacks 70 are recessed, so that recesses are formed directly over gate stacks 70 and between opposing portions of gate spacers 38. A gate mask 74 comprising one or more layers of dielectric material, such as silicon nitride, silicon oxynitride, or the like, is filled in each of the recesses, followed by a planarization process to remove excess portions of the dielectric material extending over ILD 52. The respective process is illustrated as process 230 in the process flow 200 shown in FIG. 29.

As further illustrated by FIGS. 15A and 15B, etch stop layer 75 and ILD 76 are deposited over ILD 52 and over gate masks 74. The respective process is illustrated as process 232 in the process flow 200 shown in FIG. 29. In accordance with some embodiments, etch stop layer 75 is formed through ALD, CVD, PECVD, or the like, and may be formed of silicon nitride, silicon carbide, silicon oxynitride, aluminum oxide, aluminum nitride, or the like, or multilayers thereof. ILD 76 is formed through FCVD, CVD, PECVD, or the like. ILD 76 is formed of a dielectric material, which may be selected from silicon oxide, PSG, BSG, BPSG, USG, or the like.

Figure 16B:
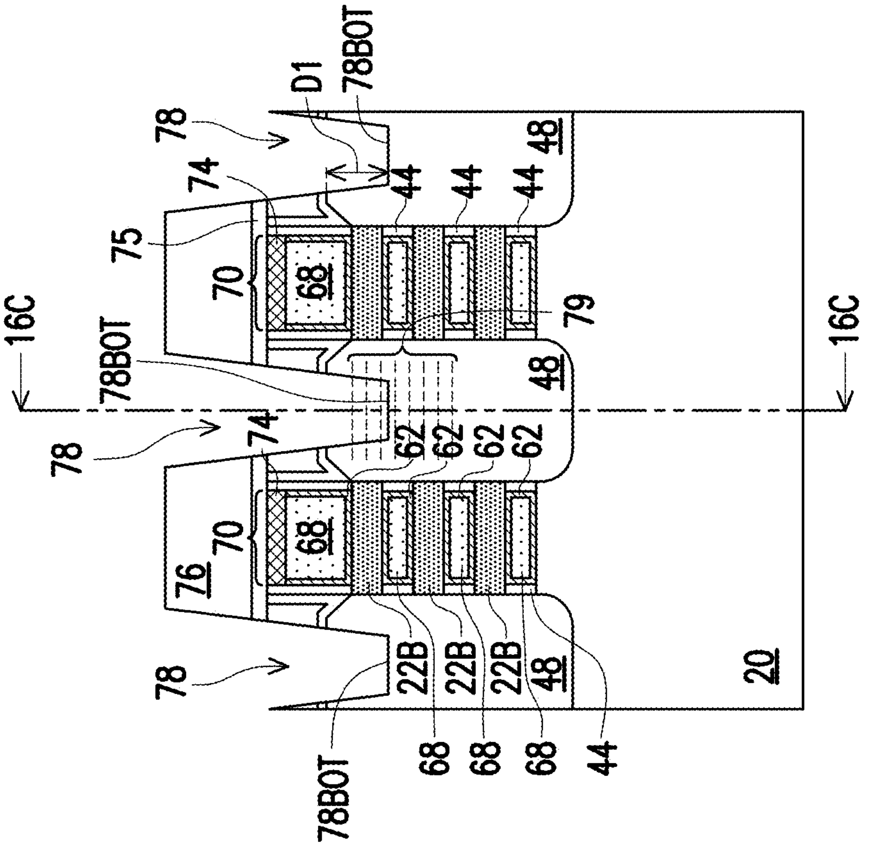
Figure 16A:
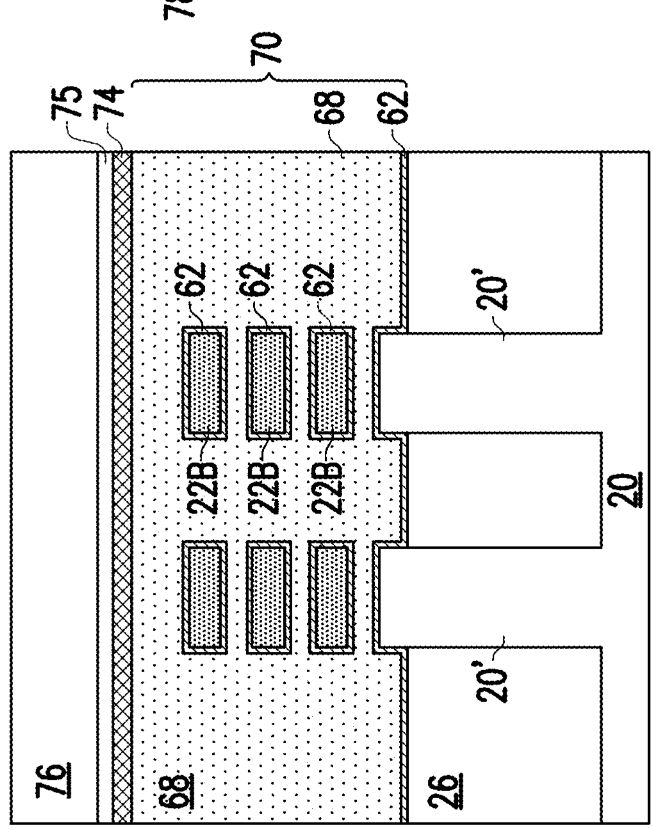
Figure 16C:
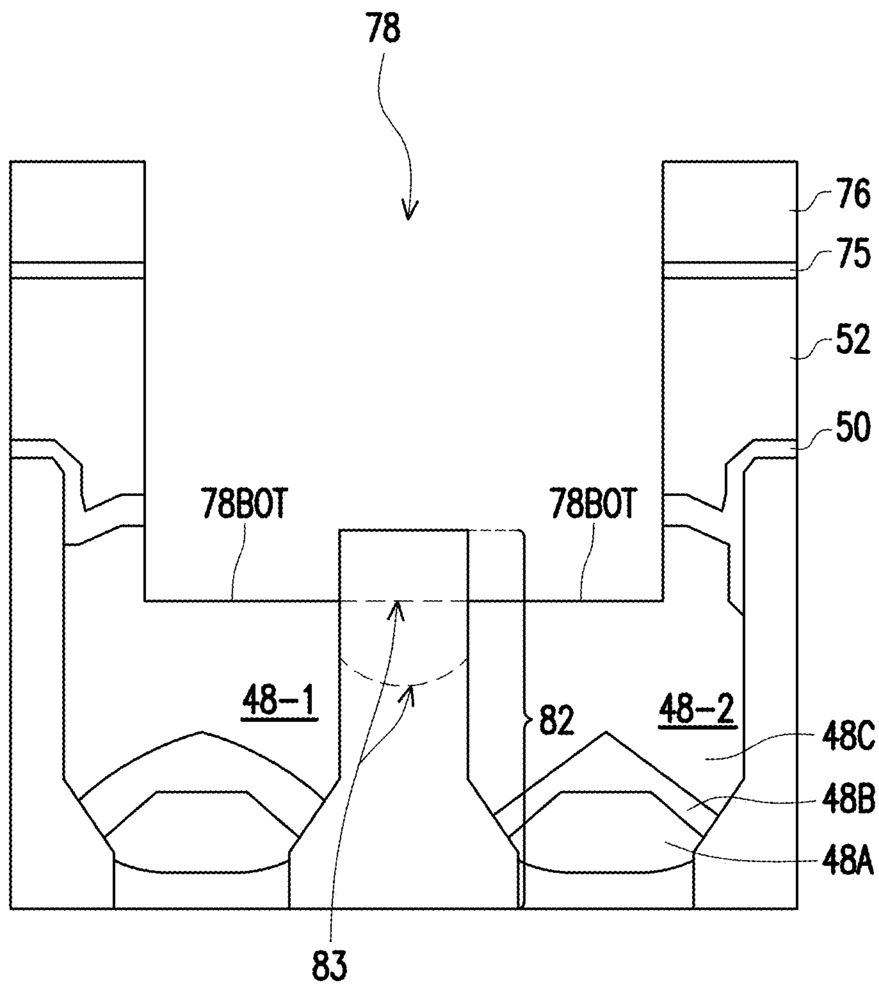

FIGS. 16A, 16B, 16C, 17A, 17B, 18A, 18B, 18C, 19A, 19B, 20A, 20B, 20C, 21A, 21B, 22A, 22B, 22C, 23A, 23B, and 23C illustrate the formation of source/drain silicide regions and source/drain contact plugs in accordance with some embodiments. Referring to FIGS. 16A, 16B, and 16C, ILD 76, etch stop layer 75, ILD 52, and CESL 50 are etched to form trenches 78. The respective process is illustrated as process 234 in the process flow 200 shown in FIG. 29. FIG. 16C illustrates reference cross-section 16C-16C in FIG. 16B, wherein trench 78 extends from a first source/drain region 48 (also referred to as 48-1) of a first transistor to a second source/drain region 48 (also referred to as 48-2) of a second transistor. In accordance with some embodiments, source/drain region 48-1 is the p-type source/drain region of a p-type transistor, and source/drain region 48-2 is the n-type source/drain region of an n-type transistor. Source/drain regions 48-1 and 48-2 are next to each other, and are separated from each other by dielectric region 82. Dielectric region 82 may be parts of CESL 50 and ILD 52, or may be another dielectric region other than CESL 50 and ILD 52. In accordance with some embodiments, dielectric region 82 is not recessed, and protrudes higher than the bottom surface 78BOT of trenches 78. In accordance with alternative embodiments, dielectric region 82 is also recessed to the same level as, or lower than, the bottom surface 78BOT of trenches 78. The corresponding top surfaces of dielectric region 82 are illustrated using dashed lines 83.

In accordance with some embodiments, ILD 76, etch stop layer 75, and ILD 52 may be etched using a same process gas or different processes. Next, CESL 50 is etched to reveal the underlying source/drain regions 48 (including 48-1 and 48-2). The etching process may be a dry etching process or a wet etching process, and the etching chemical depends on the material of CESL 50, ILD 76, etch stop layer 75, and ILD 52. After CESL 50 is etched-through, an additional dry etching process is performed to etch source/drain regions 48, so that trenches 78 extend into source/drain regions 48. The etching gas may include $C_xH_yF_z$, HBr, $Cl_2$, and/or the like. Also, the etching gas may be different from the etching gas of CESL 50 (if dry etching is adopted). The process conditions for etching source/drain regions 48 may be different from the process conditions for etching CESL 50. For example, the bias power for the dry etching of source/drain regions 48 may be higher than the bias power for the dry etching of CESL 50. In accordance with some embodiments, trenches 78 extend into source/drain regions 48 by depth D1, which may be greater than about 5 nm, and may be in the range between about 5 nm and about 10 nm.

Referring again to FIG. 16B, in accordance with some embodiments of the present disclosure, the bottoms 78BOT of trenches 78 are lower than the topmost nanostructure 22B among the plurality of nanostructure 22B. The bottoms 78BOT of trenches 78 may also be at various levels relative to the levels of the plurality of nanostructure 22B. For example, a plurality of dashed lines 79 are drawn to show possible positions of the bottoms 78BOT of trenches 78. For example, the bottoms 78BOT may be level with or lower than the top or the bottom of the topmost nanostructure 22B, or may be level with or lower than the top or bottom of the second or the third nanostructure 22B counting from top. Lowering the bottom trenches 78, or example, to be level with or lower than the top or even the bottom of the topmost nanostructure 22B may result in the improvement in the device performance. Forming trenches 78 extending deep into source/drain regions 48, however, may result in problems in the subsequent formation of silicide regions. Accordingly, processes are adjusted to solve these problems, as discussed in subsequent paragraphs.

Figure 17B:
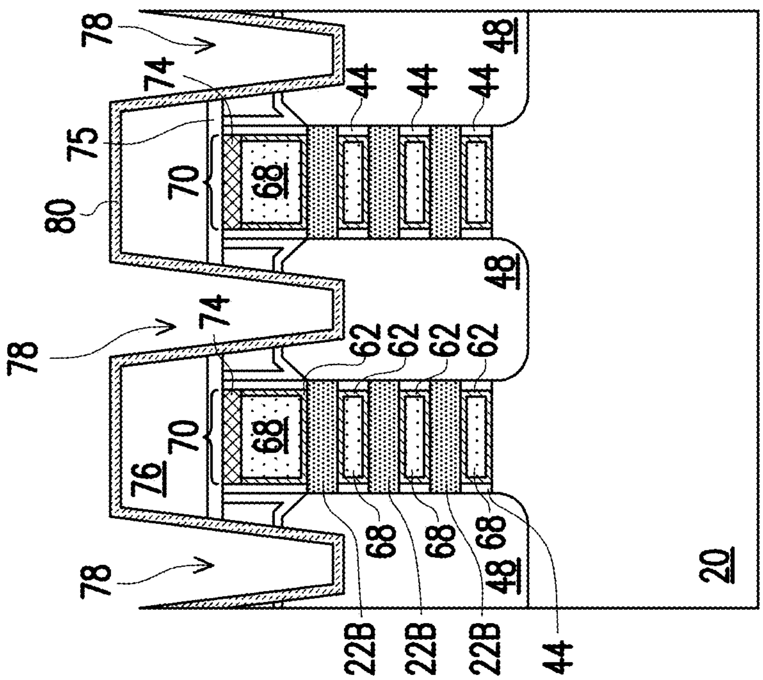
Figure 17A:
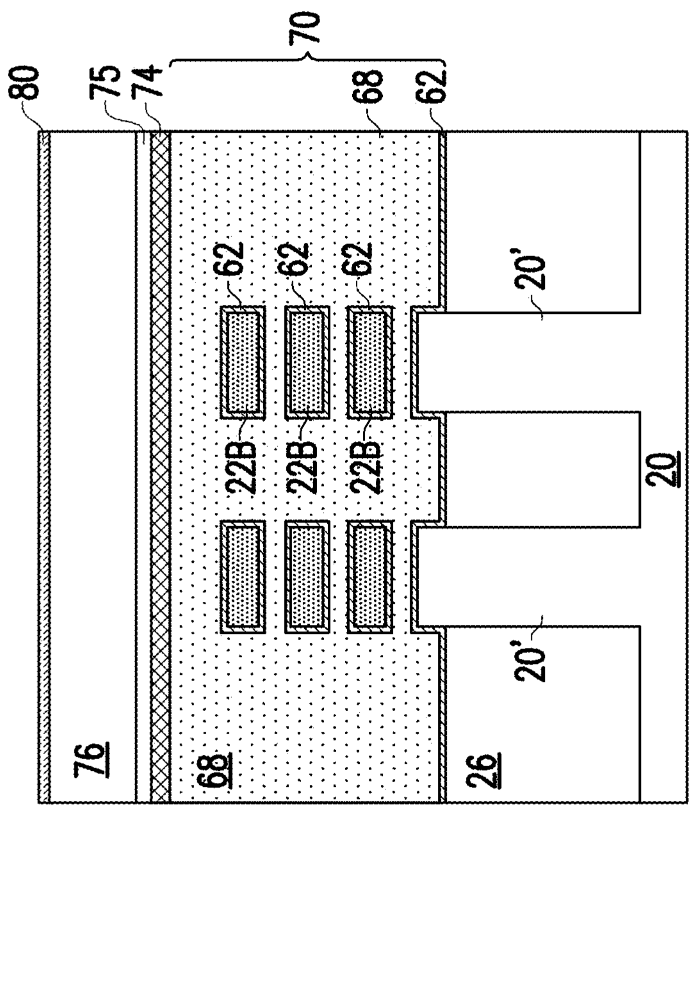
Figure 18B:
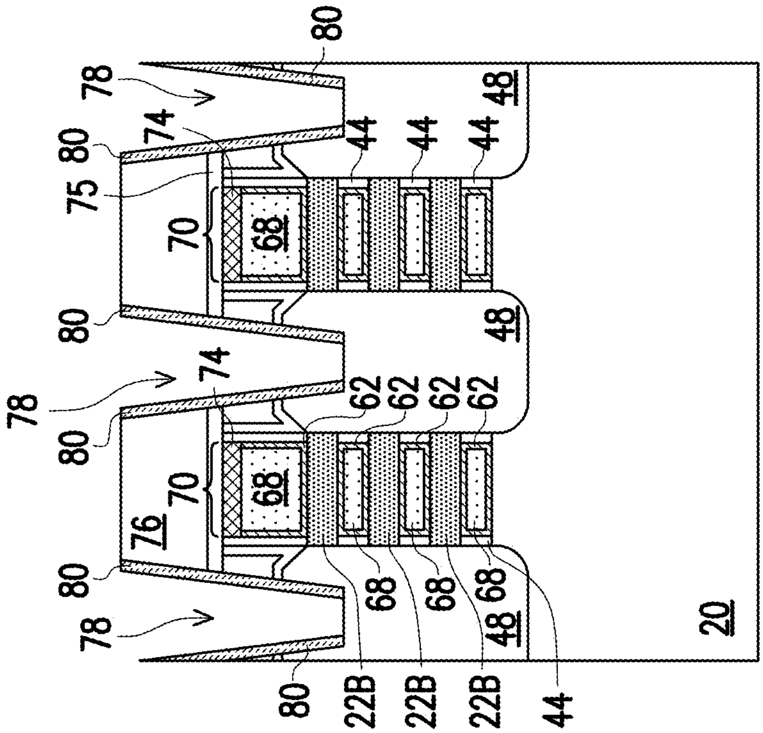
Figure 18A:
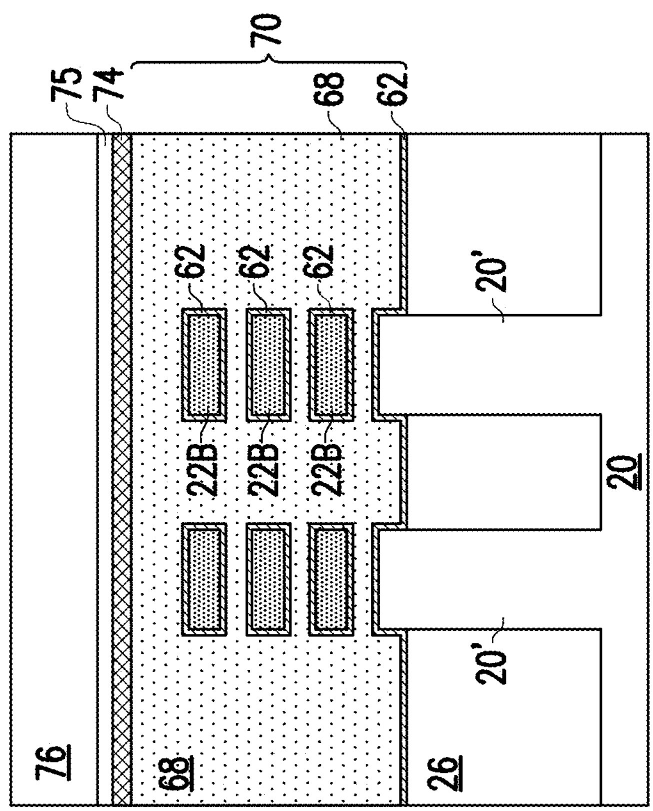
Figure 18C:
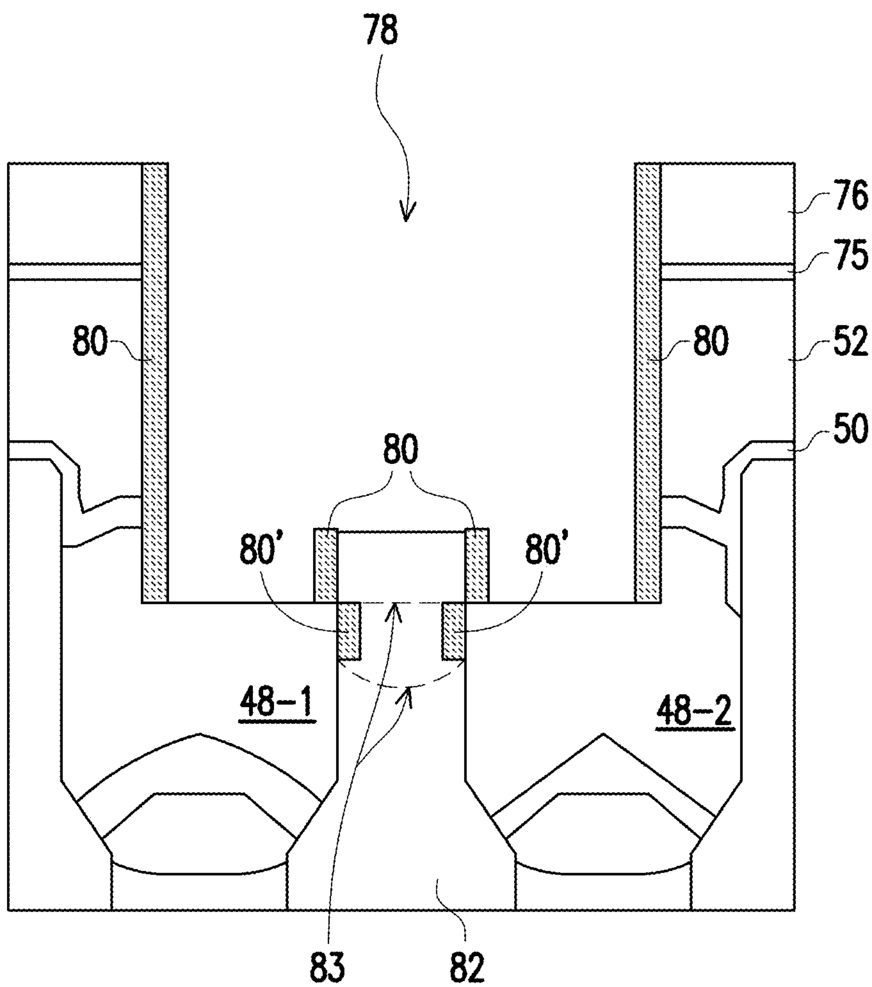

Referring to FIGS. 17A and 17B, dielectric layer 80 is formed. In accordance with some embodiments, dielectric layer 80 is formed of a dielectric material such as silicon nitride, silicon oxynitride, silicon oxide, silicon oxy-carbo-nitride, or the like. Next, an anisotropic etching process is performed to remove the horizontal portions of dielectric layer 80, leaving the vertical portions of dielectric layer 80 as an isolation layer, which forms a ring. The resulting structures are illustrated in FIGS. 18A, 18B and 18C. The respective process is illustrated as process 236 in the process flow 200 shown in FIG. 29. Referring to FIG. 18C, when dielectric region 82 has a top surface 83 lower than the top surface of the recessed source/drain regions 48, dielectric layer 80 may extend on the sidewalls of source/drain regions 48, wherein the corresponding dielectric layer 80 are illustrated as the dashed dielectric layers 80'.

Figure 19A:
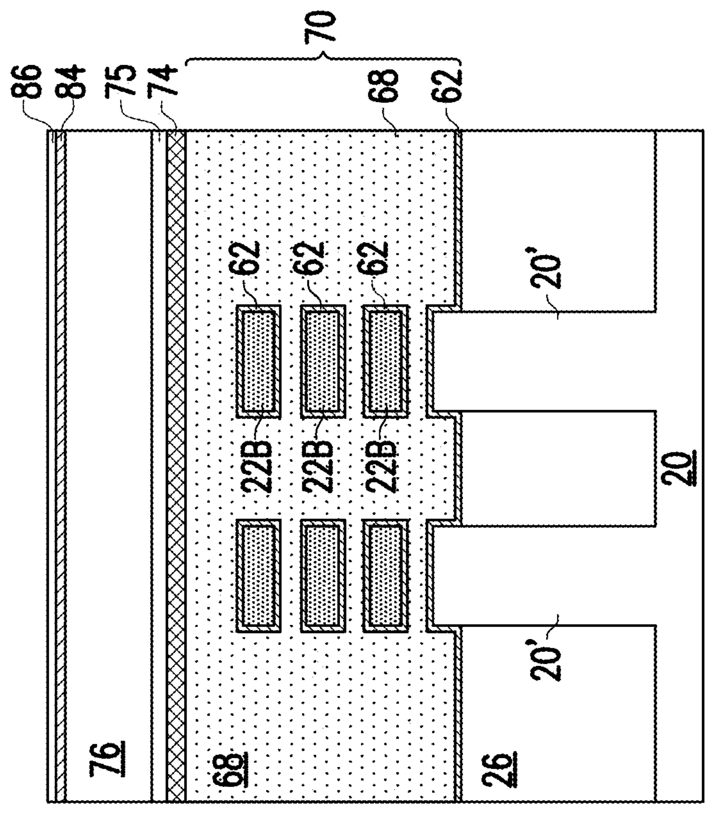
Figure 19B:
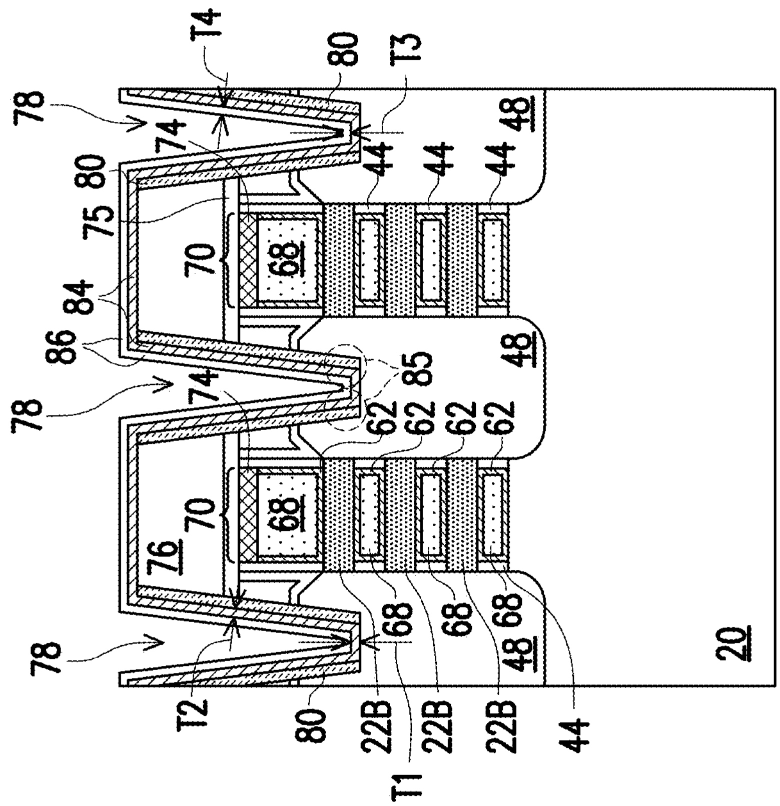

Referring to FIGS. 19A and 19B, metal layer 84 (such as a titanium layer or a cobalt layer, or the like) is deposited. The respective process is illustrated as process 238 in the process flow 200 shown in FIG. 29. Due to the extended depth of trenches 78, the deposition of metal layer 84 may be performed through a conformal deposition process such as a PECVD process. In accordance with some embodiments, metal layer 84 may be deposited by using a metal halide such as TiClx as a process gas. Hydrogen ($H_2$) may also be used as a part of the process gases. TiClx and hydrogen react to form elemental titanium and HCl, and HCl gas is evacuated through vacuuming. The reaction may be performed at a temperature in the range between about 300° C. and about 500° C. As a result of the conformal deposition process, different portions (such as horizontal portions, vertical portions, and corner portions) of metal layer 84 have a uniform thickness or a substantially uniform thickness. The bottom thickness T1 and sidewall thickness T2 of metal layer 84 are equal to or close to each other, for example, with the ratio |T1-T2|/T2 being smaller than about 20% or smaller than about 10%. In accordance with some embodiments, thicknesses T1 and T2 of metal layer 84 may be in the range between about 1 nm and bout 4 nm.

FIGS. 19A and 19B further illustrate the deposition of capping layer 86, which may be a metal nitride layer such as a titanium nitride layer. The respective process is also illustrated as process 238 in the process flow 200 shown in FIG. 29. In accordance with some embodiments, capping layer 86 is formed using CVD, PVD, PECVD, or the like. The bottom thickness T3 and sidewall thickness T4 of capping layer 86 may be equal to or close to each other, for example, with the ratio |T3-T4|/T4 being smaller than about 20% or about 10%. Alternatively, bottom thickness T3 is greater than sidewall thickness T4. For example, ratio (T3-T4)/T4 may be greater than about 0.5 or greater than about 1.0, and may be in the range between about 1.0 and about 5.0.

Figure 20B:
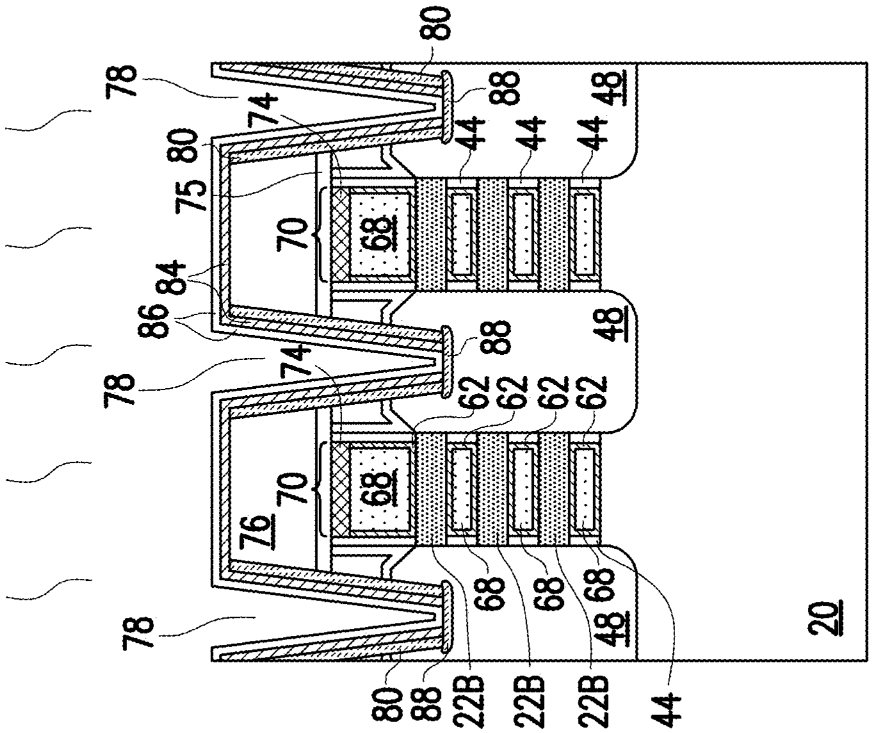
Figure 20A:
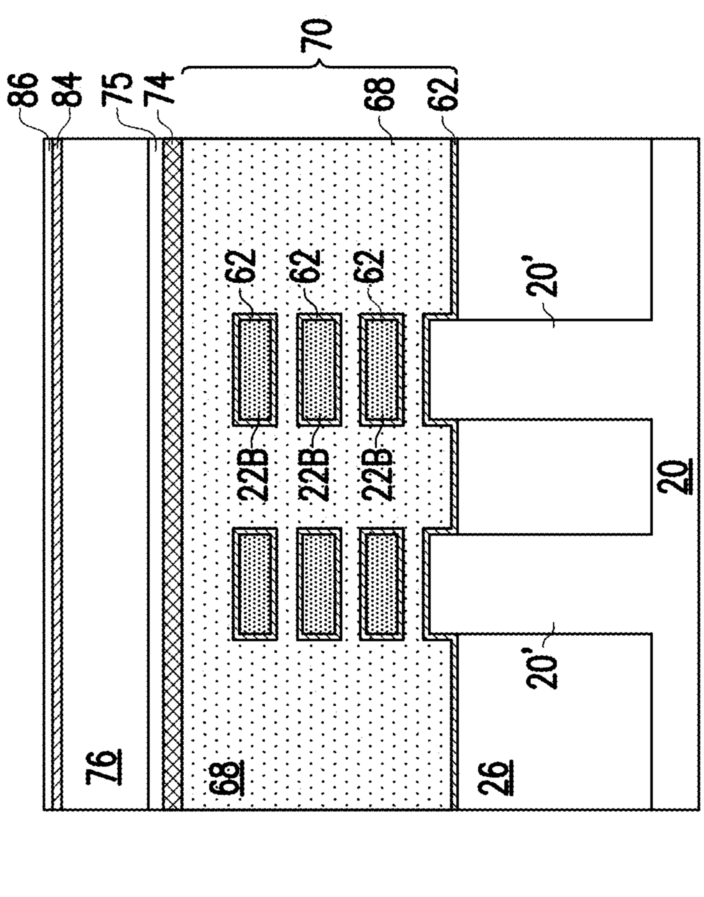
Figure 20C:
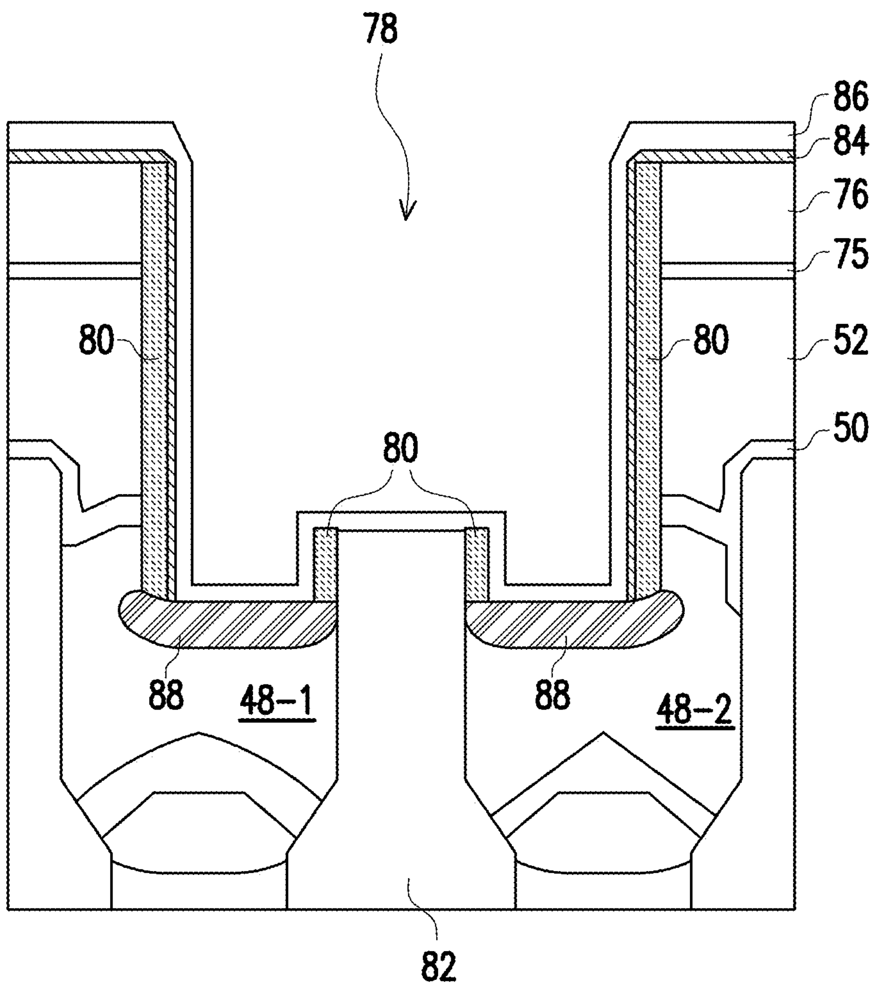

Referring to FIGS. 20A, 20B, and 20C, an annealing process is performed. In accordance with some embodiments, the annealing process is performed at a temperature in the range between about 400° C. and about 600° C. The deposition of metal layer 84, capping layer 86, and the annealing process may be in-situ performed in a same environment without vacuum break in between. Due to the elevated temperature for depositing metal layer 84, and further due to the annealing process, the bottom portions of metal layer 84 react with source/drain regions 48 to form silicide regions 88. The respective process is illustrated as process 240 in the process flow 200 shown in FIG. 29. The sidewall portions of metal layer 84 remain after the annealing process. Silicide regions 88 may be formed of silicide and/or germanide.

In subsequent processes, capping layer 86 may be removed in an etching process. In accordance with some embodiments, an additional etching process is performed to remove the remaining portions of metal layer 84. In accordance with alternative embodiments, the remaining metal layer 84 is not etched, and is left in the final contact plugs.

Figure 21B:
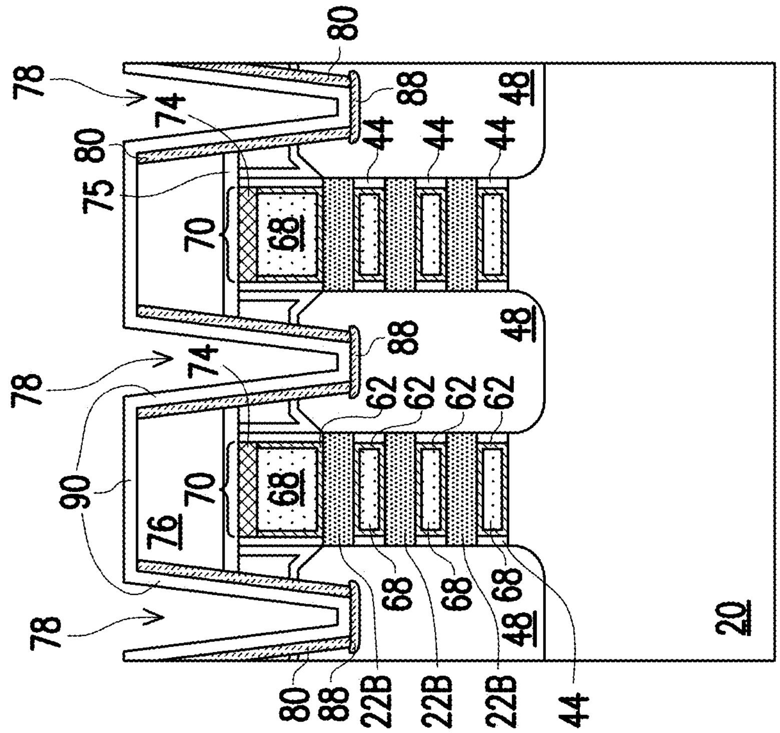
Figure 21A:
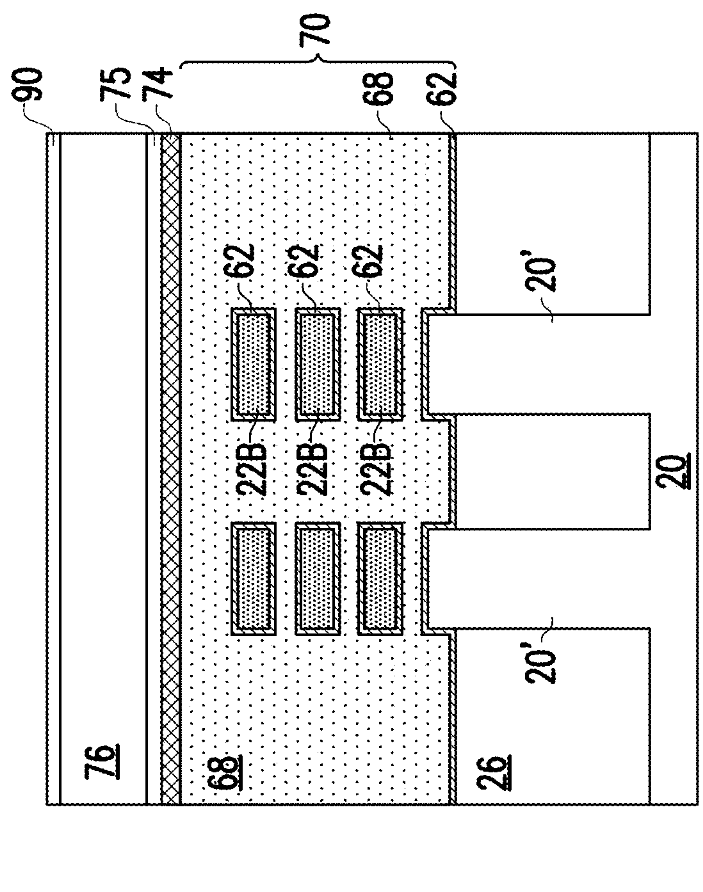
Figure 22B:
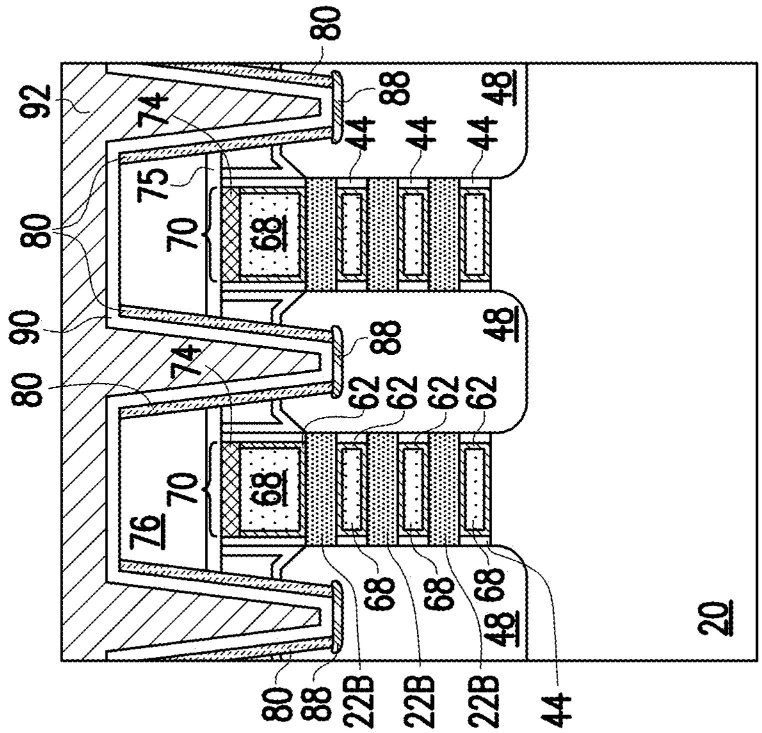
Figure 22A:
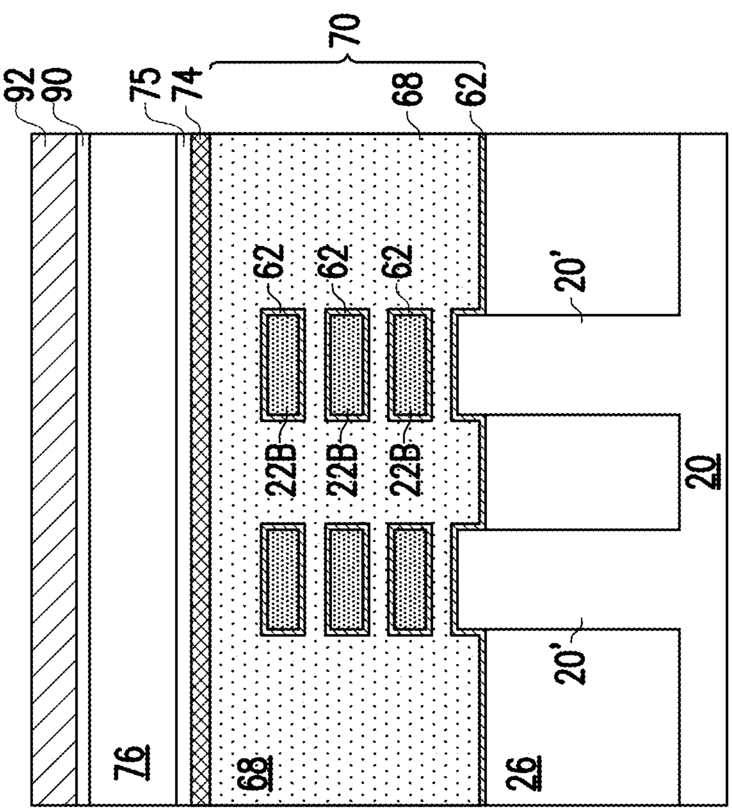
Figure 22C:
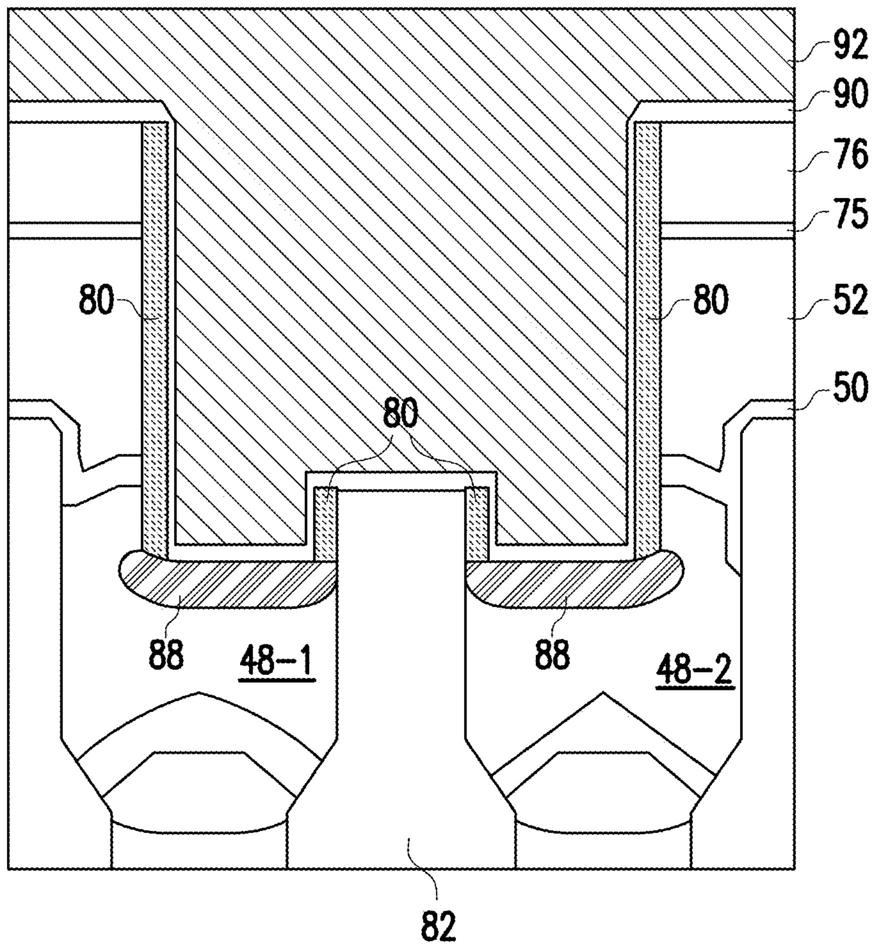
Figure 23B:
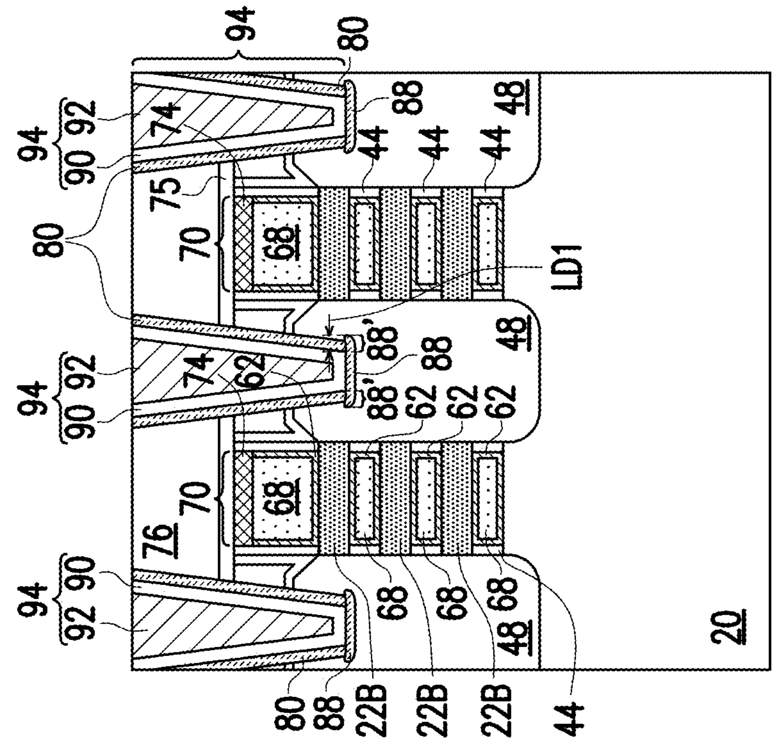
Figure 23A:
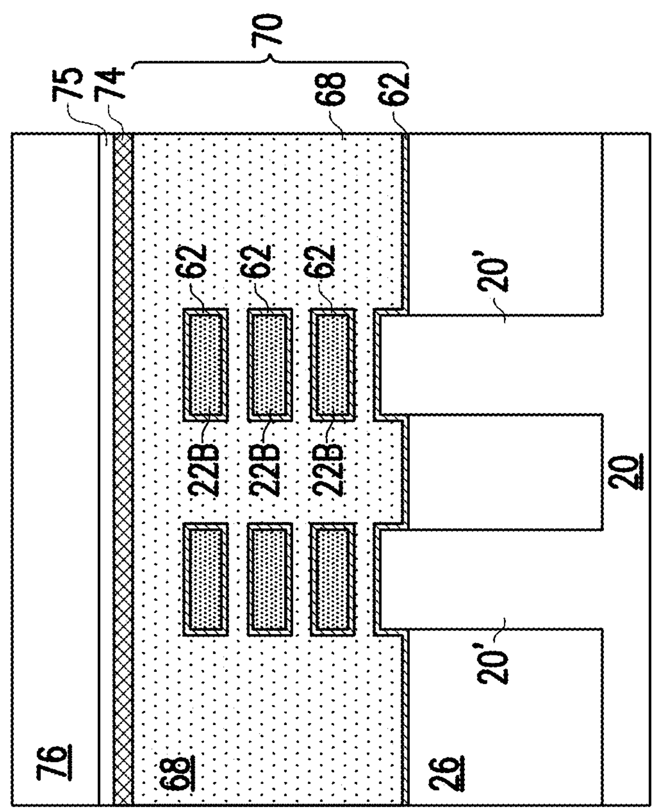
Figure 23C:
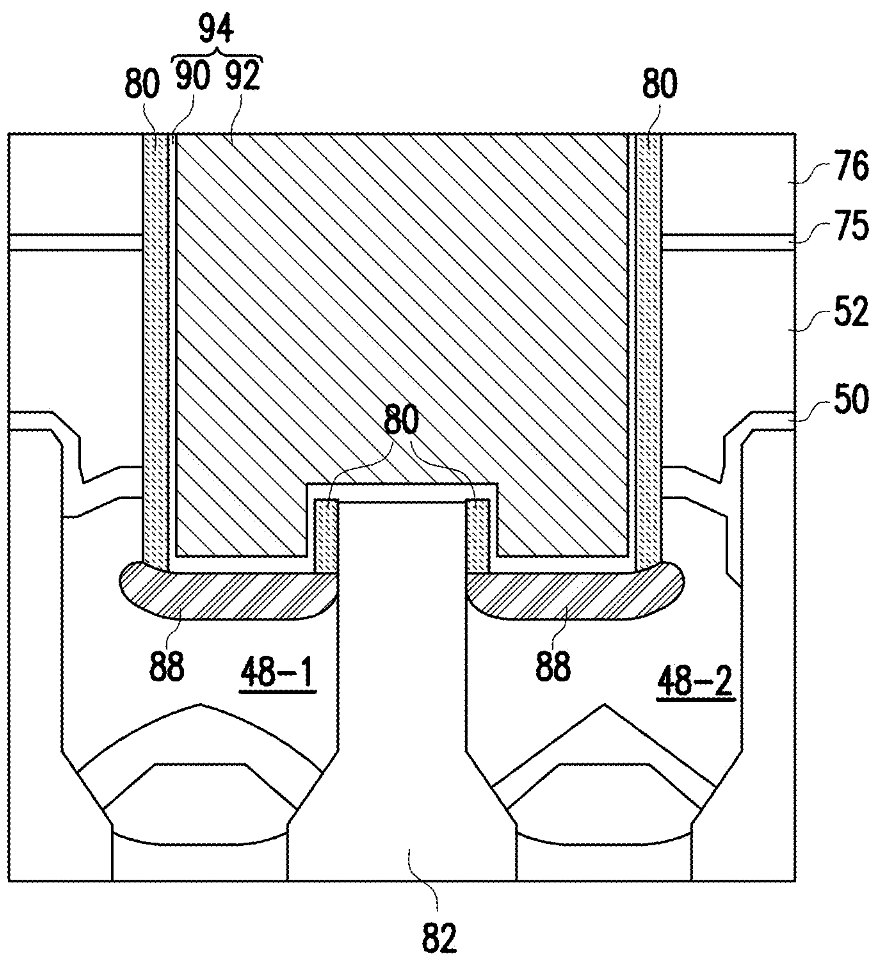

FIGS. 21A and 21B illustrate the deposition of another capping layer 90, which may comprise a metal nitride such as titanium nitride. The respective process is illustrated as process 242 in the process flow 200 shown in FIG. 29. Next, as shown in FIGS. 22A, 22B, and 22C, a filling metal 92 such as cobalt, tungsten, aluminum, or the like, is deposited. The respective process is illustrated as process 244 in the process flow 200 shown in FIG. 29. A planarization process such as a CMP process or a mechanical grinding process may be performed to remove excess material. The respective process is illustrated as process 246 in the process flow 200 shown in FIG. 29. The resulting structure is shown in FIGS. 23A, 23B, and 23C. The remaining conductive layers including 90 and 92 (and 84 if not removed) are collectively referred to as source/drain contact plugs 94.

Referring back to FIG. 19B, by using the conformal deposition process to deposit metal layer 84, metal layer 84 has a uniform thickness. Specifically, the thickness of metal layer 84 at bottom corner regions such as regions 85 have the same thicknesses as the thickness of other portions such as vertical and horizontal portions. The sizes/thickness of the resulting silicide regions 88 is related to the thickness of metal layer 84. Accordingly, the portions of silicide regions 88 (FIG. 20B) close to the bottom corner regions 85 also have increased thicknesses. This results in silicide regions 88 to have extension regions 88' (FIG. 23B), and the extension silicide regions 88' are also thick. In accordance with some embodiments, the lateral dimension LD1 of the extension regions 88' is greater than about 2 nm, and may be in the range between about 2 nm and about 3 nm. The formation of the thick and wide extension silicide regions 88' increases the size of the low-resistance landing area for source/drain contact plugs 94, and the performance of the GAA transistor is improved. In convention contact formation processes of contact plugs, PVD was used to deposit metal layer 84. PVD, however, results in non-uniform thicknesses. For example, in corner regions 85 (FIG. 19B), metal layer 84 is very thin, and extension silicide regions 88' (FIG. 23B) either do not exist, or have very small thickness. The end portions of silicide regions 88 close to the corners are also very thin and have a high resistance.

Figure 24B:
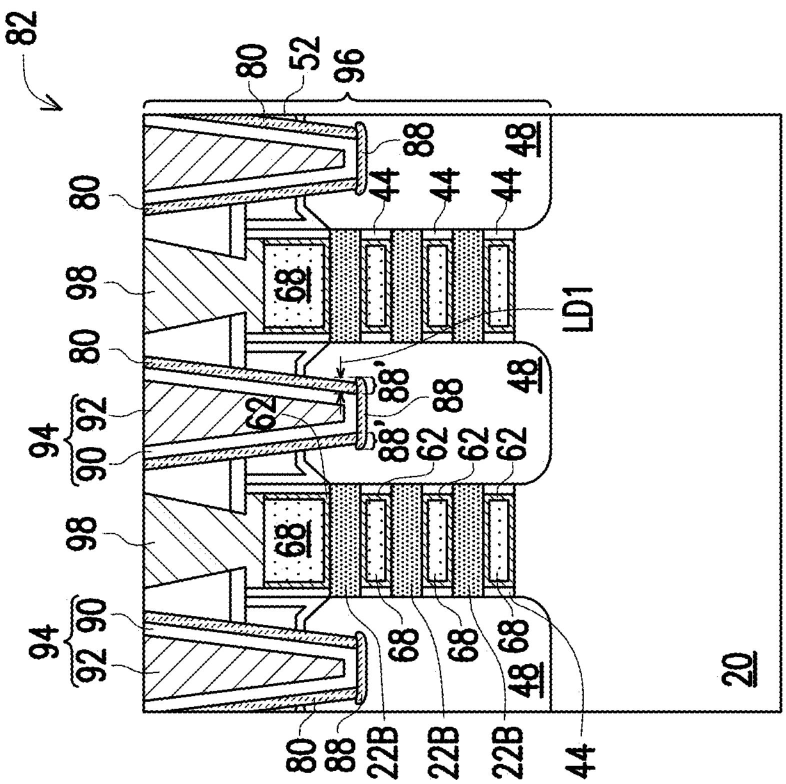
Figure 24A:
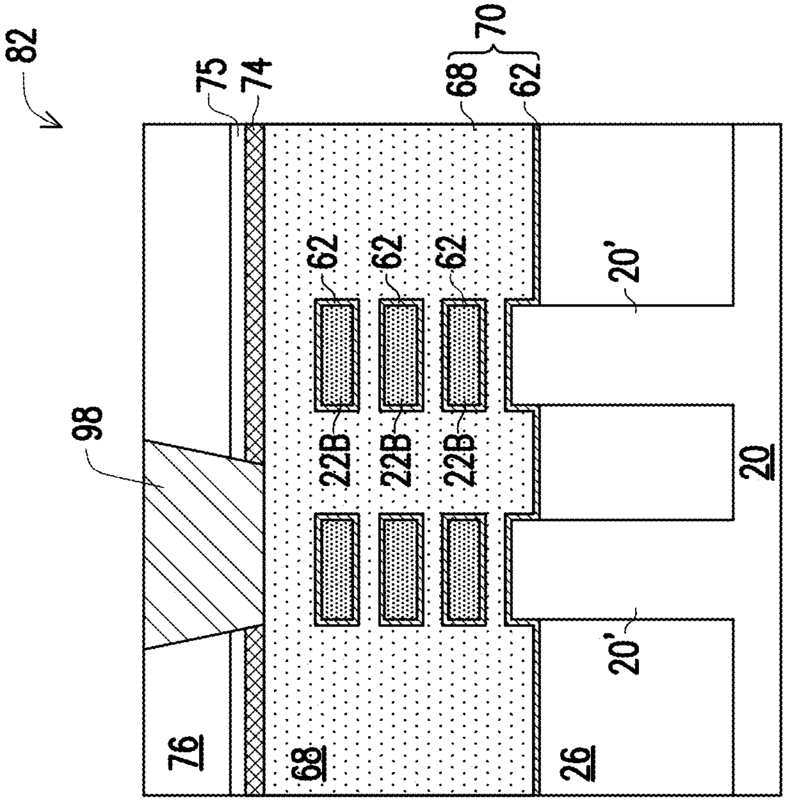

FIGS. 24A and 24B illustrate the formation of gate contact plugs 98. The formation process includes etching ILD 76, etch stop layer 75, and gate masks 74 to reveal gate electrodes 68, filling a conductive material(s) such as Ti, TiN, W, Co, or the like, and performing a planarization process. GAA transistor 96 is thus formed.

Figure 26:
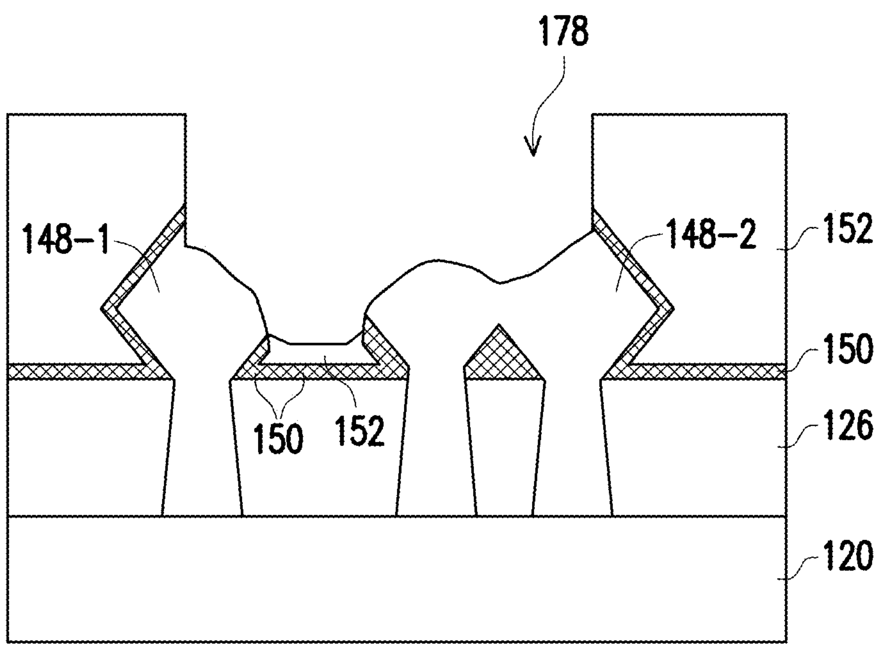
Figure 27:
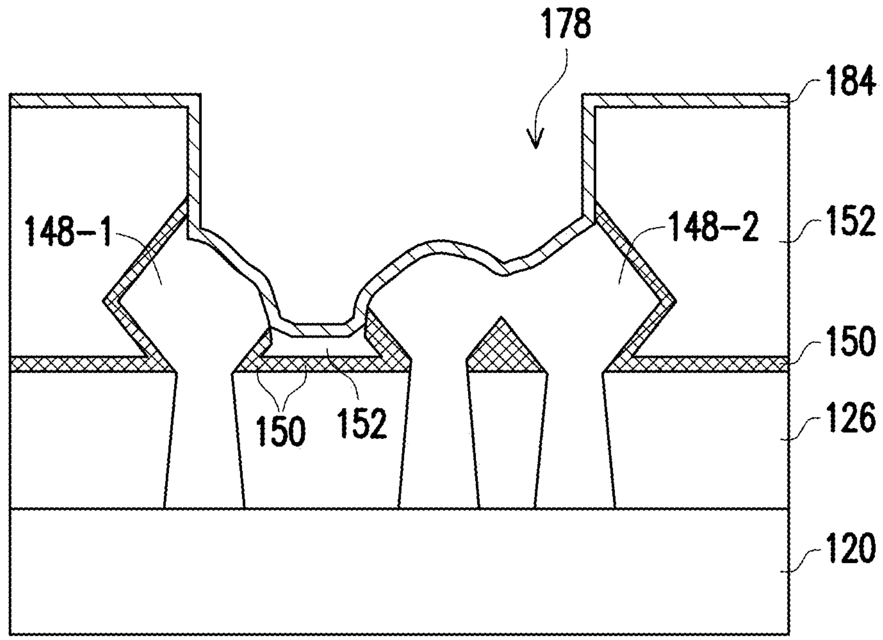
Figure 28A:
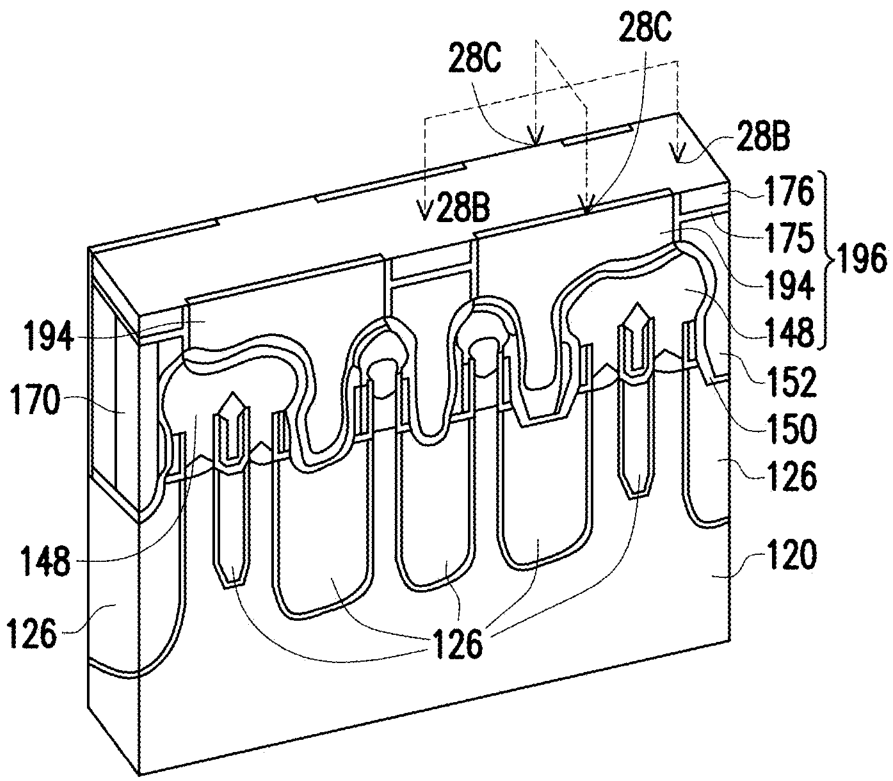
Figure 28B:
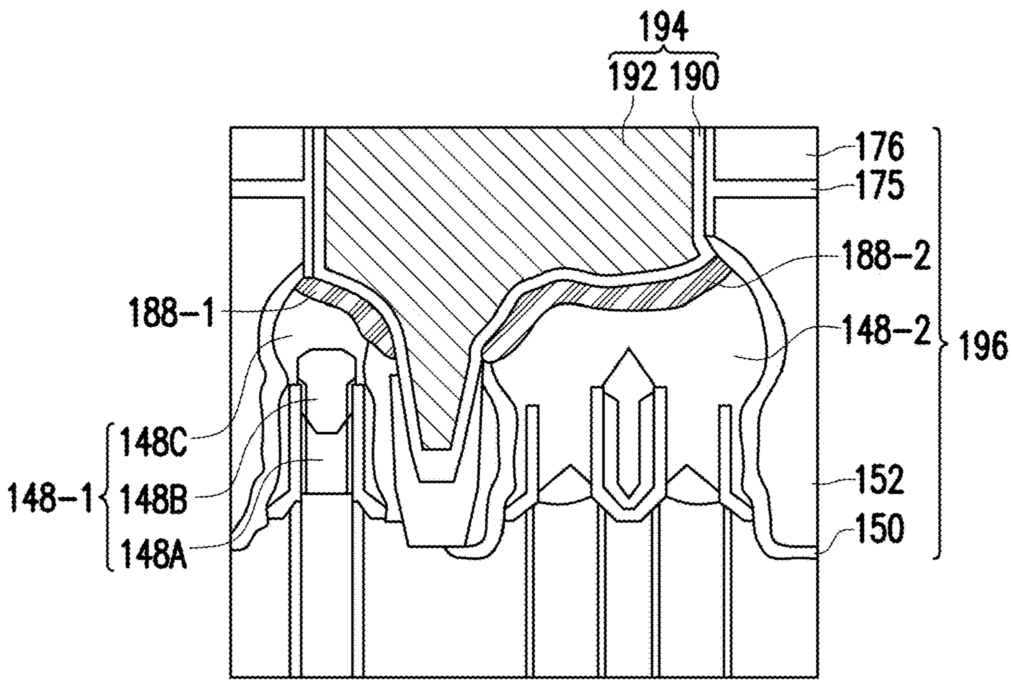
Figure 28C:
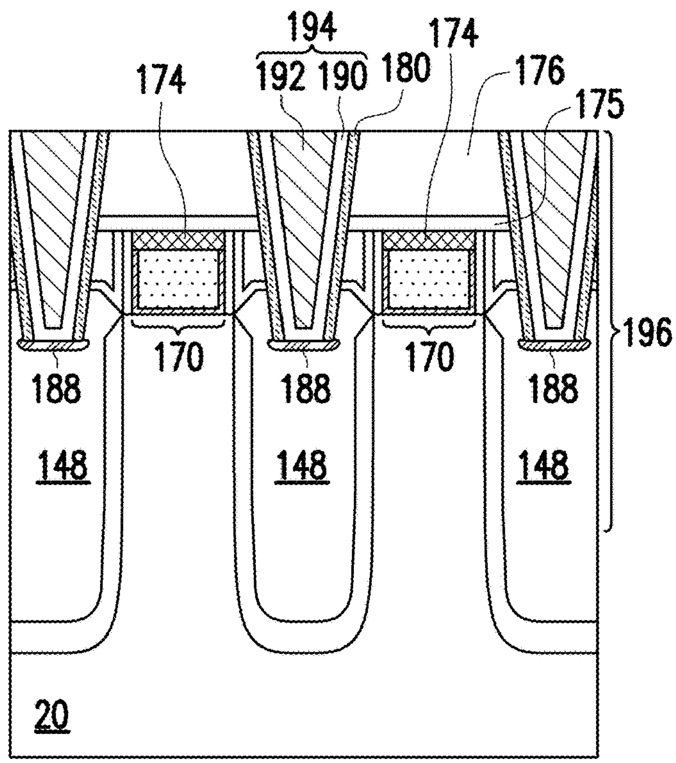

FIGS. 25-27, 28A, 28B, and 28C illustrate the cross-sectional views and a perspective in the formation of source/drain regions for a FinFET 196 (FIG. 28A) in accordance with some embodiments. FIG. 28B illustrates the reference cross-section 28B-28B in FIG. 28A. FIG. 28C illustrates the reference cross-section 28C-28C in FIG. 28A. The features in FinFETs 196 are denoted with the reference numbers of the corresponding features in GAA transistor 96 plus number "100." For example, the source/drain regions in GAA transistor 96 is denoted as 48, and accordingly, the source/drain regions in FinFET 196 is denoted as 148 (including 148-1 and 148-2), and may include sub-layers 148A, 148B, and 148C (FIG. 28B). The materials and the formation processes of the features in FinFET 196 may also be similar to the like features in GAA transistor 96, and are not repeated herein.

As shown in FIGS. 28A, 28B, and 28C, FinFET 196 includes gate stack 170 and source/drain regions 148-1 and 148-2 (FIG. 28B). Each of source/drain regions 148-1 and 148-2 may be of p-type or n-type. CESL 150, ILD 152, etch stop layer 175, and ILD 176 are illustrated. Source/drain contact plugs 194 and silicide regions 188 (including 188-1 and 188-2) are also illustrated.

FIGS. 28B and 28C illustrate the detailed views of source/drain regions 148-1 and 148-2 and silicide regions 188-1 and 188-2. Contact plug 194 includes capping layer 190 (such as titanium nitride), and metal filling region 192.

Figure 25:
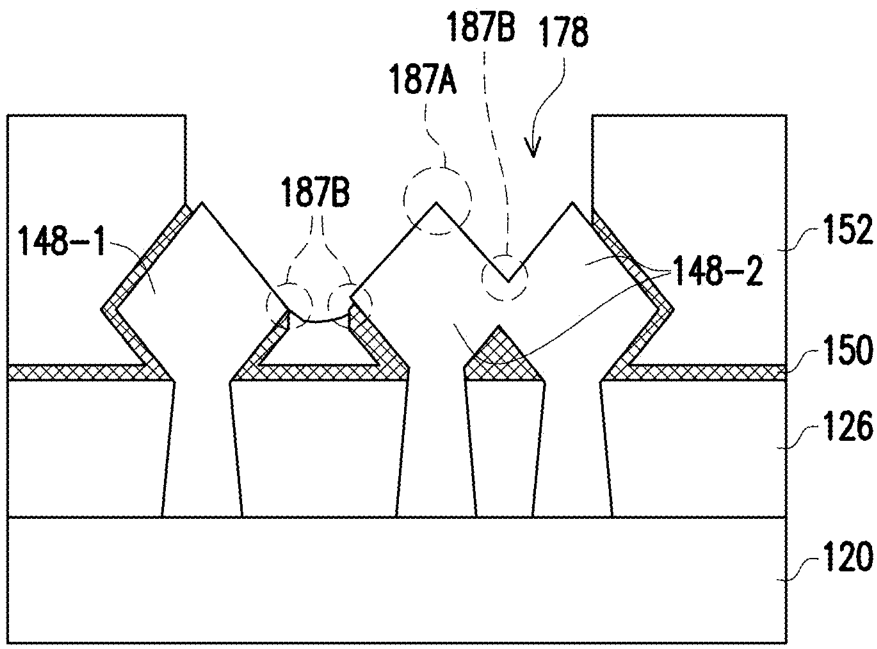
FIGS. 25-27, 28A, 28B, and 28C illustrate a perspective view and cross-sectional views in the formation of contact plugs for a Fin Field-Effect Transistor (FinFET) in accordance with some embodiments.

The contact plug 194 as shown in FIGS. 28B and 28C may be formed using the same processes for forming contact plug 94 (FIG. 24B). FIGS. 25-27 illustrate the cross-sectional views of an example process. The details of the materials, formation processes, and the structures may also be found referring to the preceding embodiments. Referring to FIG. 25, source/drain regions 148-1 and 148-2 are formed, and are close to each other. CESL 150 is formed conformally on source/drain regions 148-1 and 148-2, and ILD 152 is formed over CESL 150. ILD 152 and CESL 150 are etched to form source/drain contact opening 178. Next, as shown in FIG. 26, source/drain regions 148-1 and 148-2 are etched deeply, for example, with a removed top portion having the thickness greater than about 5 nm or in the range between about 5 nm and about 10 nm. A dielectric layer (similar to layer 180 in FIGS. 17B and 18B, not shown) may be, or may not be, formed to extend into source/drain contact opening 178. FIG. 27 illustrates the formation of metal layer 184, which is deposited using a conformal deposition process such as PECVD. Metal layer 184 may have a thickness variation (between different parts) to be smaller than about 20 percent or smaller than about 10 percent. The subsequent processes are essentially the same as shown in FIGS. 19A/19B through 24A/24B, and are not illustrated herein. The resulting FinFET 196 is as shown in FIGS. 28A, 28B, and 28C.

It is appreciated that the deep etch of source/drain regions 148 may improve the performance of the resulting transistor. The deep etch, however, makes the resulting metal layer 184 to be more non-conformal when PVD is used to form metal layer 184, and hence metal layer 184 will be thick in region 187A (FIG. 25), and thin in regions 187B. Accordingly, the silicide regions formed in regions 187B will be thin and small, and the contact resistance will be high. Furthermore, the overly thick metal layer 184 in region 187A and over ILD 176 may need extra process to remove.

The embodiments of the present disclosure have some advantageous features. By deeply etching source/drain regions, the performance of the resulting transistors is improved. By using a conformal deposition process to form a metal layer, which is used for forming silicide regions, the edge portions of the resulting silicide regions are thick, and the silicide regions have increased landing area for the overlying source/drain contact plugs. The conformal deposition of the metal layer thus also solves the problem introduced by the deep etching of source/drain regions.

In accordance with some embodiments of the present disclosure, a method comprises forming a gate stack; growing a source/drain region on a side of the gate stack through epitaxy; depositing a CESL over the source/drain region; depositing an inter-layer dielectric over the CESL; etching the inter-layer dielectric and the CESL to form a contact opening; etching the source/drain region so that the contact opening extends into the source/drain region; depositing a metal layer extending into the contact opening, wherein horizontal portions, vertical portions, and corner portions of the metal layer have a substantially uniform thickness; performing an annealing process to react the metal layer with the source/drain region, wherein a source/drain silicide region is formed; and filling the contact opening to form a source/drain contact plug. In an embodiment, the metal layer is deposited using a PECVD process. In an embodiment, the method further comprises depositing a titanium nitride layer over the metal layer, wherein the titanium nitride layer is deposited as having a sidewall thickness and a bottom thickness greater than the sidewall thickness. In an embodiment, the titanium nitride layer is deposited using a PVD process. In an embodiment, the CESL is etched using a first etching chemical, and the source/drain region is etched using a second etching chemical different from the first etching chemical. In an embodiment, the gate stack is formed on a multilayer stack comprising a plurality of nanostructures and a plurality of sacrificial layers located alternatingly, and the contact opening has a bottom level with or lower than a bottom surface of a topmost nanostructure in the plurality of nanostructures. In an embodiment, the bottom of the contact opening is level with or lower than a top surface of a second nanostructure in the plurality of nanostructures, wherein the second nanostructure is counted from the topmost nanostructure down. In an embodiment, the source/drain silicide region extends laterally beyond edges of the source/drain contact plug by distances greater than about 2 nm. In an embodiment, the method further comprises, before the metal layer is deposited, depositing a dielectric layer extending into the contact opening; and etching to remove horizontal portions of the dielectric layer, wherein a vertical portion of the dielectric layer is left in the contact opening to form a dielectric ring. In an embodiment, the metal layer is formed by reacting a metal halide with hydrogen.

In accordance with some embodiments of the present disclosure, a method comprises etching a an inter-layer dielectric and a CESL to form a contact opening and to reveal a semiconductor region, wherein the semiconductor region is aside of a multilayer stack, and the multilayer stack comprises a plurality of sacrificial layers and a plurality of semiconductor layers, and wherein the plurality of sacrificial layers and the plurality of semiconductor layers are located alternatingly; etching the semiconductor region to extend the contact opening further into the semiconductor region, wherein the semiconductor region has a first top surface higher than a second top surface of the multilayer stack, and the etching the semiconductor region is performed until a bottom surface of the contact opening is lower than a top surface of a topmost semiconductor layer in the plurality of semiconductor layers; depositing a metal layer, wherein the metal layer extends into the contact opening; depositing a capping layer over the metal layer; and performing an annealing process, wherein a bottom portion of the metal layer reacts with the semiconductor region to form a silicide region. In an embodiment, the metal layer is conformal, and the capping layer is non-conformal and comprising a horizontal portion having a first thickness greater than a second thickness of a vertical portion of the capping layer. In an embodiment, the depositing the metal layer is performed using PECVD. In an embodiment, the depositing the capping layer is performed using PVD. In an embodiment, the CESL is etched using a wet etching process, and the semiconductor region is etched using a dry etching process. Both of the CESL and the semiconductor region are etched using dry etching processes, and the CESL and the semiconductor region are etched using different etching gases.

In accordance with some embodiments of the present disclosure, a method comprises etching an inter-layer dielectric and a CESL underlying the inter-layer dielectric to form a contact opening, wherein a semiconductor region underlying the CESL is revealed through the contact opening; depositing a dielectric layer extending into the opening; performing an anisotropic etching process on the dielectric layer to remove horizontal portions of the dielectric layer, wherein a vertical portion of the dielectric layer is left in the opening to form a dielectric ring; depositing a metal layer extending into the opening using a PECVD process; and depositing a titanium nitride layer over the metal layer using a PVD process; and reacting a bottom portion of the metal layer with the semiconductor region to form a silicide region, the metal layer is deposited as a conformal layer, and the titanium nitride layer is deposited as a non-conformal layer. In an embodiment, the metal layer comprises titanium, and the depositing the metal layer comprises using titanium chloride as a precursor. In an embodiment, the method further comprises, after the semiconductor region is revealed, changing etching chemical to further etch the semiconductor region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

etching an inter-layer dielectric and a Contact Etch Stop Layer (CESL) underlying the inter-layer dielectric to form a contact opening, wherein a semiconductor region underlying the CESL is revealed through the contact opening;

after the semiconductor region is revealed, changing etching chemical to further etch the semiconductor region;

depositing a dielectric layer extending into the contact opening;

performing an anisotropic etching process on the dielectric layer to remove horizontal portions of the dielectric layer, wherein a vertical portion of the dielectric layer is left in the contact opening to form a dielectric ring;

depositing a metal layer extending into the contact opening using a Plasma Enhanced Chemical Vapor Deposition (PECVD) process; and depositing a titanium nitride layer over the metal layer using a Physical Vapor Deposition (PVD) process; and reacting a bottom portion of the metal layer with the semiconductor region to form a silicide region.

2. The method of claim 1, wherein the metal layer is deposited as a conformal layer, and the titanium nitride layer is deposited as a non-conformal layer.

3. The method of claim 1, wherein the metal layer comprises titanium, and the depositing the metal layer comprises using titanium chloride as a precursor.

4. A method comprising:

forming a gate stack on a multilayer stack, wherein the multilayer stack comprises a plurality of sacrificial layers and a plurality of semiconductor layers, and wherein the plurality of sacrificial layers and the plurality of semiconductor layers are located alternatingly, and a bottom surface of the gate stack contacts a topmost surface of a topmost one of the plurality of semiconductor layers;

etching a an inter-layer dielectric and a Contact Etch Stop Layer (CESL) to form a contact opening and to reveal a semiconductor region, wherein the semiconductor region is aside of the multilayer stack;

etching the semiconductor region to extend the contact opening further into the semiconductor region, wherein the semiconductor region has a first top surface higher than a level of the topmost surface, and the etching the semiconductor region is performed until an additional bottom surface of the contact opening is lower than the level of topmost surface;

depositing a metal layer, wherein the metal layer extends into the contact opening;

depositing a capping layer over the metal layer; and performing an annealing process, wherein a bottom portion of the metal layer reacts with the semiconductor region to form a silicide region.

5. The method of claim 4, wherein the CESL is etched using a wet etching process, and the semiconductor region is etched using a dry etching process.

6. The method of claim 4, wherein both of the CESL and the semiconductor region are etched using dry etching processes, and the CESL and the semiconductor region are etched using different etching gases.

7. The method of claim 4, wherein the metal layer is conformal, and the capping layer is non-conformal and comprising a horizontal portion having a first thickness greater than a second thickness of a vertical portion of the capping layer.

8. The method of claim 7, wherein the depositing the metal layer is performed using Plasma Enhanced Chemical Vapor Deposition (PECVD).

9. The method of claim 8, wherein the depositing the capping layer is performed using Physical Vapor Deposition (PVD).

10. A method comprising:

forming a gate stack;

growing a source/drain region on a side of the gate stack through epitaxy;

depositing a contact etch stop layer (CESL) over the source/drain region;

depositing an inter-layer dielectric over the CESL;

etching the inter-layer dielectric and the CESL to form a contact opening;

etching the source/drain region so that the contact opening extends into the source/drain region;

depositing a metal layer extending into the contact opening, wherein horizontal portions, vertical portions, and corner portions of the metal layer have a substantially uniform thickness;

performing an annealing process to react the metal layer with the source/drain region, wherein a source/drain silicide region is formed; and filling the contact opening to form a source/drain contact plug, wherein the source/drain silicide region extends laterally beyond edges of the source/drain contact plug by distances greater than about 2 nm.

11. The method of claim 10, wherein the CESL is etched using a first etching chemical, and the source/drain region is etched using a second etching chemical different from the first etching chemical.

12. The method of claim 10 further comprising:

before the metal layer is deposited, depositing a dielectric layer extending into the contact opening; and etching to remove horizontal portions of the dielectric layer, wherein a vertical portion of the dielectric layer is left in the contact opening to form a dielectric ring.

13. The method of claim 10, wherein the metal layer is formed by reacting a metal halide with hydrogen.

14. The method of claim 10, wherein the CESL and the source/drain region are etched using different process conditions.

15. The method of claim 10, wherein the CESL is etched using a wet etching process, and the source/drain region is etched using a dry etching process.

16. The method of claim 10, wherein the gate stack is formed on a multilayer stack comprising a plurality of nanostructures and a plurality of sacrificial layers located alternatingly, and the contact opening has a bottom level with or lower than a bottom surface of a topmost nanostructure in the plurality of nanostructures.

17. The method of claim 16, wherein the bottom of the contact opening is level with or lower than a top surface of a second nanostructure in the plurality of nanostructures, wherein the second nanostructure is counted from the topmost nanostructure down.

18. The method of claim 10, wherein the metal layer is deposited using a Plasma Enhanced Chemical Vapor Deposition (PECVD) process.

19. The method of claim 18 further comprising depositing a titanium nitride layer over the metal layer, wherein the titanium nitride layer is deposited as having a sidewall thickness and a bottom thickness greater than the sidewall thickness.

20. The method of claim 19, wherein the titanium nitride layer is deposited using a Physical Vapor Deposit (PVD) process.

* * * * *